United States Patent [19] [11] Patent Number: 5,228,047
Matsumoto et al. [45] Date of Patent: Jul. 13, 1993

[54] SEMICONDUCTOR LASER DEVICE AND A METHOD FOR PRODUCING THE SAME

[75] Inventors: Mitsuhiro Matsumoto, Tenri; Kazuaki Sasaki, Yao; Masaki Kondo, Nara; Tadashi Takeoka; Hiroshi Nakatsu, both of Tenri; Masanori Watanabe, Nara; Osamu Yamamoto, Nara; Saburo Yamamoto, Nara, all of Japan

[73] Assignee: Sharp Kabushiki Kaisha, Osaka, Japan

[21] Appl. No.: 762,769

[22] Filed: Sep. 20, 1991

[30] Foreign Application Priority Data

Sep. 21, 1990 [JP] Japan ................................. 2-252929
Oct. 19, 1990 [JP] Japan ................................. 2-283125
Mar. 22, 1991 [JP] Japan ................................. 3-59059
Sep. 17, 1991 [JP] Japan ................................. 3-236646

[51] Int. Cl.$^5$ ............................................... H01S 3/19
[52] U.S. Cl. ......................................... 372/45; 372/48; 372/49
[58] Field of Search ............................... 372/49, 48, 45

[56] References Cited

U.S. PATENT DOCUMENTS 4,731,792 3/1988 Shimizu et al. ....................... 372/49
4,879,725 11/1989 Kawanishi et al. .................. 372/48
4,901,328 2/1990 Matsui et al. ......................... 372/49

FOREIGN PATENT DOCUMENTS 0388149 9/1990 European Pat. Off. .
55-27474 7/1980 Japan .
2195822 4/1988 United Kingdom .

OTHER PUBLICATIONS

Patent Abstracts of Japan, vol. 13, No. 226, (E-763)[3574] May 25, 1989.
Patent Abstracts of Japan, vol. 13, No. 147, (E-741) Apr. 11, 1989.
Patent Abstracts of Japan, vol. 13, No. 548, (E-856) Dec. 7, 1989.
Patent Abstracts of Japan, vol. 13, No. 334, (E-797) Aug. 3, 1989.
Nannichi et al., *Japanese J. Appl. Phys.* (1988) 27(12):L2367-2369.
Sasaki et al., *Japanese J. Appl. Phys.* (1991) 30(5B):L904-L906.
K. Itaya et al., Preprint of Annual Meeting of the Society of Applied Physics, Spring 1988, pp. 904-905 (31a-ZP-4 and 31a-ZP-5).
S. Yamamoto et al., *Applied Physics Letters* (1982) 40(5):372-374.

*Primary Examiner*—Georgia Y. Epps
*Attorney, Agent, or Firm*—Morrison & Foerster

[57] ABSTRACT

A semiconductor laser device is provided which is constituted by semiconductor materials so as to emit laser light from a cavity end facet, the laser light being excited in a waveguide within an active layer sandwiched between a pair of cladding layers, wherein a window layer made of a semiconductor material having a band gap greater than that of the active layer is formed on the cavity end facet from which the laser light is emitted, so as to have a thickness sufficient to prevent local generation of crystal defects by lattice mismatching between the semiconductor material of the window layer and the semiconductor materials at the cavity end facet. There is also provided a method for producing such a semiconductor laser device with high efficiency.

14 Claims, 27 Drawing Sheets

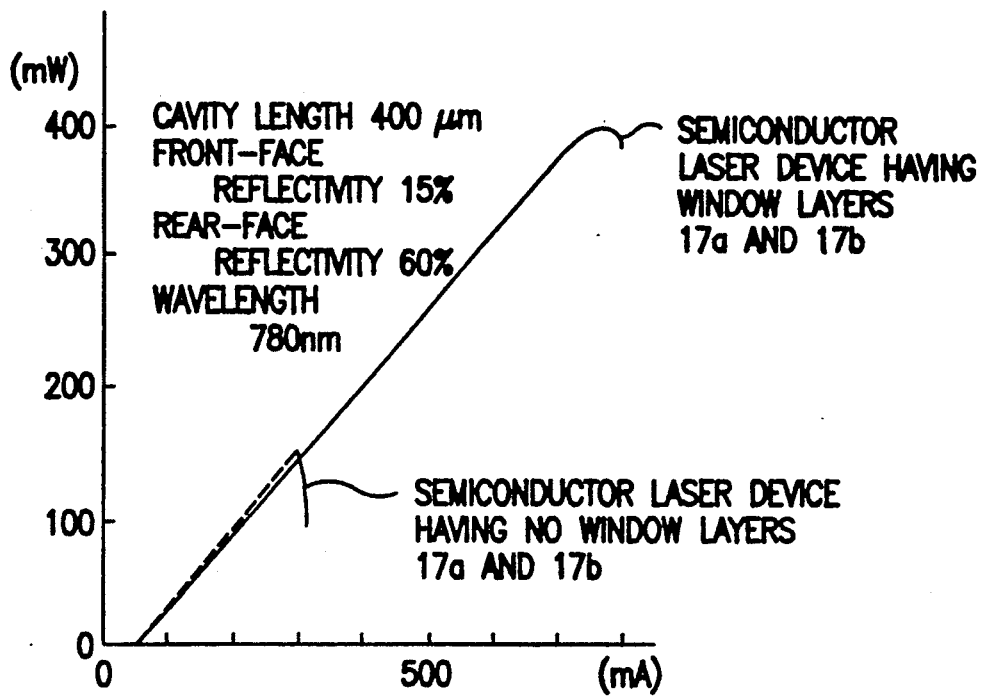
FIG. 13
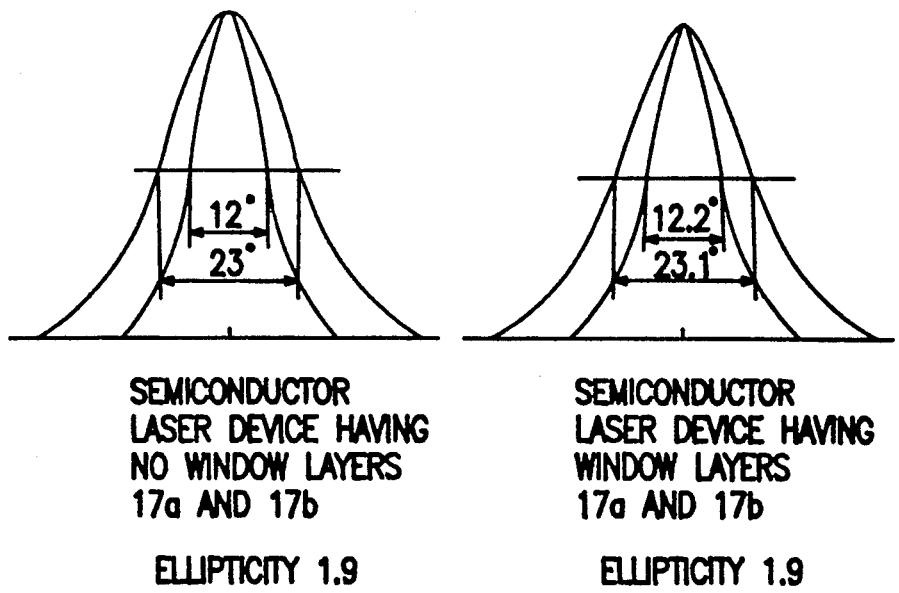
FIG. 14B
PRIOR ART
FIG. 14A

FIG. 27A
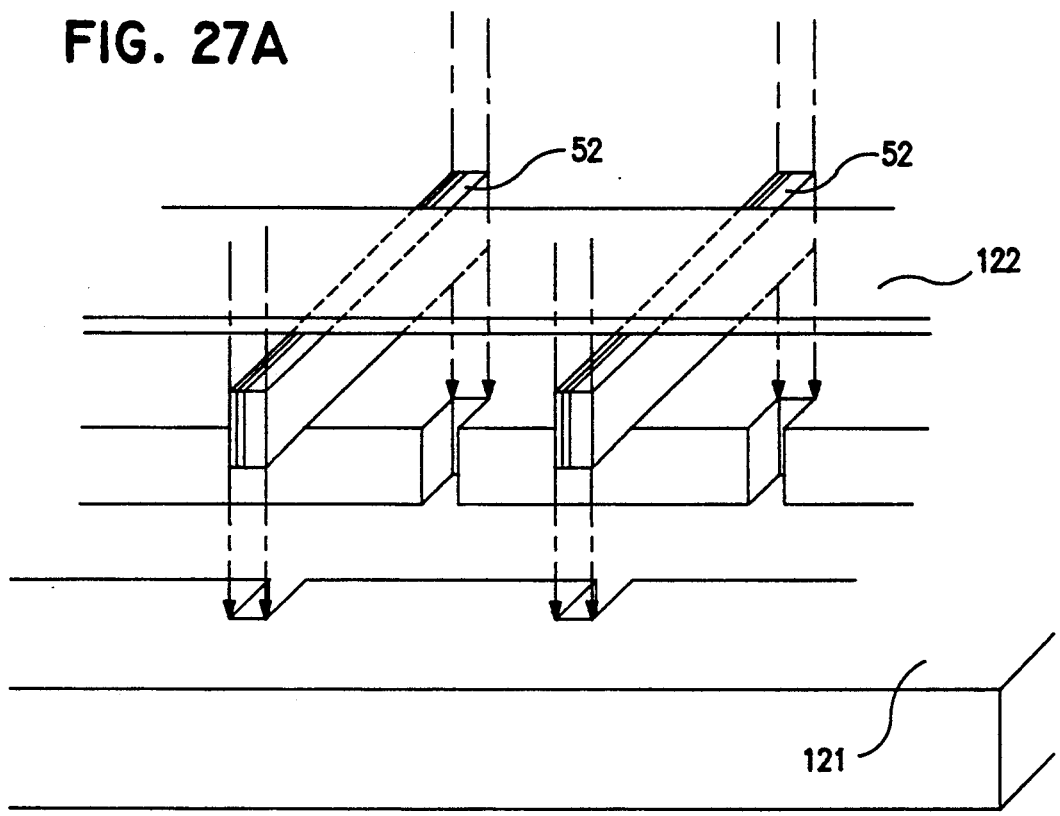
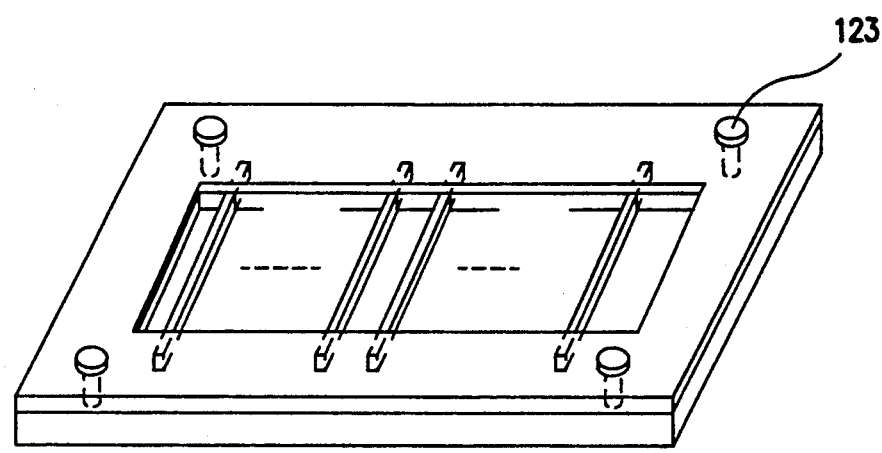
FIG. 27B

SEMICONDUCTOR LASER DEVICE AND A METHOD FOR PRODUCING THE SAME

BACKGROUND OF THE INVENTION

1. Field of the Invention

This invention relates to a semiconductor laser device which can attain high reliability even when operated at a high output power level for a long period of time, and more particularly, it relates to a semiconductor laser device which can preferably be used for an optical pickup apparatus. This invention also relates to a simple method for producing such a semiconductor laser device.

2. Description of the Prior Art

A semiconductor laser device which emits laser light from an end facet thereof is a typical example of the semiconductor devices produced by use of the cleavage of semiconductor crystals. A semiconductor laser device of this type has a Fabry-Perot cavity having a pair of end facets and functioning on the basis of a difference in refractive index between the semiconductor crystals and the air outside the device.

In recent years, semiconductor laser devices as described above have widely come into practical use as light sources for various information processing apparatuses such as optical disc driving units and laser printers because they can emit laser light with excellent divergence and high directivity. When semiconductor laser devices are used as the light sources for write-once optical disc driving units or rewritable optical disc driving units, they are required to have high reliability even at a high output power level of about 40 to 50 mW for a long period of time. Furthermore, for the purpose of attaining higher operational speed of an entire system including an optical disc driving unit, there is a demand for semiconductor laser devices which can attain laser oscillation at a still higher output power level. When semiconductor laser devices are used as the light sources for high-resolution laser printers or for optical pumping of solid state laser devices such as a YAG laser, they are required to attain laser oscillation at an output power level of 100 mW or more.

For example, conventional semiconductor laser devices which are prepared from AlGaAs-type semiconductor materials can attain an output power level of about 30 to 40 mW. The higher output power operation of such semiconductor laser devices, however, causes the deterioration of their end facets from which laser light is emitted. The deterioration in the light-emitting facet increases the current required for driving the semiconductor laser device, and eventually it becomes impossible for the laser device to attain laser oscillation. Therefore, with respect to semiconductor laser devices, it is difficult to attain high reliability at a high output power level.

The principal cause for the deterioration of the light-emitting facet is now described. First, heat is generated locally at the light-emitting facet due to the high optical density at this facet and also due to non-radiative recombination caused by the surface state. As the temperature in the area near the facet increases, the band gap in that area becomes smaller, which in turn increases the absorption of light. The increase in the light absorption generates carriers, which are then trapped in the surface state, and non-radiative recombination of the carriers occurs. This further generates heat in the area near the light-emitting facet. This process takes place until the temperature in the area near the facet reaches the melting point of the semiconductor, resulting in facet breakdown.

Moreover, intensive studies to develop semiconductor laser devices which are prepared from InGaAlP-type semiconductor materials and emit red light with a wavelength of 600 nm have been made for the purpose of increasing the density of optical discs or increasing the operational speed of laser printers. In spite of a demand for laser oscillation at a high output power level, the high output power operation of such semiconductor laser devices also causes the deterioration of their end facets from which laser light is emitted (see, e.g., Itaya et al., Preprint of Annual Meeting of the Society of Applied Physics, Spring 1988, 31a-ZP-4,5).

Furthermore, it is desirable that semiconductor laser devices which are used as light sources of optical pickup apparatuses for writing and erasing data on optical discs not only have high output characteristics but also have a small ellipticity $\theta_v/\theta_h$ which is a ratio of the vertical far-field pattern $\theta_v$ to the horizontal far-field pattern $\theta_h$. Particularly, in the case of a semiconductor laser device having an ellipticity of 2 or less, it is unnecessary to use a beam-reshaping prism for reshaping an elliptical beam emitted from the semiconductor laser device into a circular beam.

When a beam-reshaping prism is used, there is a problem that a light-converging spot is shifted by a change in the wavelength of laser light at the time of writing data on an optical disc. At the time of writing data on an optomagnetic disc, a semiconductor laser device as a light source is used at a high output power level of 30 to 50 mW, and the oscillation spectrum of the semiconductor laser device is in a single mode.

If a light-converging spot is completely focused on the plane of an optical disc by use of a focusing servo system, the wavelength of light emitted from the semiconductor laser device is shifted to the longer wavelength side by the presence of return light from the disc plane. This is because the laser light is allowed to have a gain by the return light, so that the gain distribution peak is shifted to the longer wavelength side by a rate corresponding to the wavelength shift.

In general, beam-reshaping prisms have chromatic aberration, that is, the refractive direction of laser light changes depending upon the wavelength of the laser light. Therefore, if the oscillation wavelength of a semiconductor laser device is shifted by 3 to 10 nm as described above, the light-converging spot is forced to deviate on the plane of an optical disc, and the length of data (bits) written in the optical disc changes, so that it cannot be accurately read out.

It is difficult to avoid the wavelength shift of laser light to the longer wavelength side, because this shift is due to the physical phenomenon that the gain distribution of laser light is changed by return light. Therefore, if no beam-reshaping prism is used, it is possible to prevent the deviation of a light-converging spot. To achieve this prevention, however, the ellipticity of a laser beam emitted from a semiconductor laser device as a light source should be two or less.

To decrease the ellipticity of a laser beam, an attempt has been made to form a waveguide having a width narrower in the cavity portion near the end facets than in the center potion. For example, there can be mentioned a V-channeled substrate inner stripe (VSIS) semiconductor laser device (see, e.g., Appl. Phys. Lett., 40, 372 (1982)), which is produced as follows. First, an n-GaAs layer is grown on a p-GaAs substrate to a thickness of about 1,000 nm and a V-striped channel is formed through the n-GaAs layer in the p-GaAs substrate by photolithography and etching, after which a p-GaAlAs cladding layer filling in the V-striped channel, a p-GaAlAs active layer, an n-GaAlAs cladding layer, and an n-GaAs contact layer are successively grown by liquid phase epitaxy.

The VSIS semiconductor laser device has a loss-guide structure in which light exuding from the active layer is absorbed by the substrate at the shoulder portion of the V-striped channel and this optical loss causes a difference in effective refractive index between the inside and the outside of the V-striped channel. The waveguide width is determined mainly by the width W of the V-striped channel. In a typical case, W=5,000 nm, and the half-value width $\theta_h$ of the horizontal far-field pattern along the junction direction becomes 9° to 10°. Moreover, the half-value width $\theta_v$ of the vertical far-field pattern along the direction perpendicular to the junction direction becomes 23° to 24°. Thus, the ellipticity $\theta_v/\theta_h$ amounts to 2 or more.

Accordingly, an attempt has been made to form a waveguide having a width narrower in the cavity portion near the end facets than in the center portion. For example, if the waveguide width is 3,500 nm at each of the cavity end facets, but it gradually increases with an increase in the distance from the cavity end facet and becomes a uniform width of 5,000 nm in the cavity center portion, the spot of a laser beam is defined by the waveguide width at the light-emitting facet. In a semiconductor laser device having a waveguide 3,500 nm in width at the light-emitting facet, the spot of a laser beam emitted therefrom is narrowed down and the vertical far-field pattern becomes 12°, so that the ellipticity can be made two or less.

Because the spot of a laser beam is narrowed down at the light-emitting facet in this way, however, light density is increased and non-radiative recombination centers are formed by oxidation of the light-emitting facet, so that deterioration can readily be caused in the light-emitting facet. Therefore, when the above-described semiconductor laser device is operated at a high output power level of 50 mW or more, there is problem that the reliability thereof may decrease.

In the case of an InGaAlP semiconductor laser device, it is well known that if the end facets thereof are covered with an $Al_2O_3$ dielectric film the end facets can be shielded from contact with oxygen so that the end facets can be prevented from degrading. Even in such a semiconductor laser device, however, the dielectric film is formed on the end facets after the formation of the cavity end facets in air by cleavage, and there is oxygen at the interface between the cavity end facet and the dielectric film. Therefore, when the semiconductor laser device is operated to emit laser light, the presence of oxygen causes the deterioration in the end facets.

To prevent the deterioration in the cavity end facets, an improved semiconductor laser device is known, in which a semiconductor crystal having a band gap greater than that of the active layer is grown on the cavity end facets so as to cover the cavity end facets therewith.

In a typical example of the AlGaAs semiconductor laser devices, as shown in FIG. 24, an $Al_{0.45}Ga_{0.55}As$ cladding layer 82, an $Al_{0.15}Ga_{0.85}As$ active layer 83, an $Al_{0.45}Ga_{0.55}As$ cladding layer 84, and a GaAs contact layer 85 are successively grown on a GaAs substrate 81. Laser light is excited within the active layer 83 and emitted from the cavity end facet 80a. On the cavity end facet 80a, an $Al_{0.4}Ga_{0.6}As$ window layer 86 having an Al mole fraction greater than that of the active layer 83 so as to have a band gap greater than that of the active layer 83.

If such a window layer 86 is grown on the cavity end facet so as to come in contact with the active layer 83, crystal strains are generated in the window layer 86, because the Al mole fraction of the window layer 86 is greater than that of the active layer 83. These crystal strains become crystal defects, and it is therefore impossible to attain high reliability when the semiconductor laser device is operated at a high output power level.

As a method for forming a semiconductor layer having a greater band gap than that of the active layer on the end facets to prevent the deterioration of the end facets, for example, in the case of GaAs/GaAlAs-type semiconductor laser devices, a GaAlAs semiconductor layer having a greater band gap (i.e., having a greater Al mole fraction) than that of the active layer is grown by vapor phase epitaxy on the light-emitting facet formed by cleavage. Such a semiconductor layer is referred to as a large-band-gap layer.

FIGS. 30A to 30H show the conventional production of a V-channel substrate inner stripe (VSIS) semiconductor laser device (see, e.g., Appl. Phys. Lett., 40, 372 (1982)) which is a typical laser for use in optical disc driving units. In particular, FIGS. 30A and 30B show a wafer in which a number of VSIS structures are formed, and one of these VSIS structures, respectively. The VSIS lasers are produced as follows.

First, on a p-GaAs substrate 11, an n-GaAs layer 12 is grown to have a thickness of about 1 μm by liquid phase epitaxy. Then, a V-striped channel 19 reaching the p-GaAs substrate 11 through the n-GaAs layer 12 is formed by photolithography and etching, after which a p-$Ga_{0.55}Al_{0.45}As$ cladding layer 13 (having a thickness of 0.2 μm outside the V-striped channel 19), a p-$Ga_{0.88}Al_{0.12}As$ active layer 14 (having a thickness of 0.07 μm), an n-$Ga_{0.55}Al_{0.45}As$ cladding layer 15 (having a thickness of 1 μm), and an n-GaAs cap layer 16 (having a thickness of 1 μm) are successively grown by liquid phase epitaxy. Laser light exuding from the active layer 14 is absorbed by the shoulder portion of the V-striped channel 19 and this optical loss causes a difference in effective refractive index between the inside and the outside of the V-striped channel, resulting in a loss-guide structure.

The back face of the p-GaAs substrate 11 is rubbed to a wafer thickness of about 100 μm, followed by cleavage of the wafer into bar-shaped wafers 51 (referred hereinafter to as laser bars), as shown in FIG. 30C. In this figure, the illustration of the V-striped channel and other elements shown in FIG. 30A is omitted for simplicity. Thereafter, as shown in FIG. 30D, the respective laser bars 51 are introduced into a preparatory chamber 101 for MOCVD growth, and carried on a susceptor 104 in a growth chamber 103 by the use of a vacuum suction-type pincette 102. On the cleavage plane 52 of the laser bars 51, a $Ga_{0.5}Al_{0.5}As$ semiconductor layer 53 having a greater band gap than that of the active layer 14 is grown, and the laser bars 51 are carried back in the growth preparatory chamber 101 by the use of the vacuum suction-type pincette 102. Then, the laser bars 51 are taken out of the preparatory chamber 101 (FIG. 30E).

In the laser bar 51 shown in FIG. 30E, the semiconductor layer 53 having a greater band gap than that of the active layer 14 has been grown on the upper face of the n-GaAs cap layer 16, as well as both cleavage planes 52. After removing the semiconductor layer 53 on the n-GaAs cap layer 16 by etching, electrodes 54 and 55 are formed by vacuum deposition on the back face of the p-GaAs substrate 11 and the upper face of the n-GaAs cap layer 16, respectively, as shown in FIG. 30F. Moreover, on the semiconductor layer 53 formed on the cleavage plane 52, an end-facet protective film 57 is formed, as shown in FIGS. 30G and 30H. Finally, the laser bar 51 is separated into chips, and the respective chips are mounted on a heat sink, resulting in a plurality of high-power semiconductor laser devices.

In the conventional production method which has been proposed as described above, however, the process of growing a semiconductor layer having a greater band gap than that of the active layer on the cleavage plane of the laser bar includes the step of carrying the laser bar from the growth preparatory chamber directly into the growth chamber, so that it is necessary to carry the laser bar many times and much effort is needed.

Moreover, the position of the laser bar placed on the susceptor may be deviated from the original position by a turbulent gas flow during the above-described growth, and it is difficult to control the position of the laser bar against the gas flow. Therefore, the thickness of a semiconductor layer grown on the cleavage plane may be varied for each growth, and the thickness distribution may be generated even in the same laser bar. For example, even when the thickness of a semiconductor layer to be grown on the cleavage plane is set to be 0.5 $\mu$m, the thickness of the semiconductor layer actually grown has a distribution ranging from 0.01 to 10 $\mu$m, and in particular, semiconductor layers having a thickness of 3 $\mu$m or less cannot be grown with high controllability. If the semiconductor layer grown on the cleavage plane has a thickness of 3 $\mu$m or more, stain in the large-band-gap layer 53 is increased by a difference in the lattice constant between the p-GaAs substrate 11 and the large-band-gap layer 53, so that the large-band-gap layer 53 has poor crystallinity, and in a severe case, large crystal defects are generated in the large-band-gap layer 53.

In such a case, the semiconductor laser device having a large-band-gap layer on the cleavage plane may have poor device characteristics, as compared with a conventional semiconductor laser device having no large-band-gap layer on the cleavage plane. The semiconductor laser device having a large-band-gap layer on the cleavage plane cannot attain sufficient reliability, when it is used alone as a light source or incorporated into a system such as a pickup for optical disc driving units.

SUMMARY OF THE INVENTION

The semiconductor laser device according to this invention, which overcomes the above-discussed and numerous other disadvantages and deficiencies of the prior art, is constituted by semiconductor materials so as to emit laser light from a cavity end facet, the laser light being excited in a waveguide within an active layer sandwiched between a pair of cladding layers, wherein a window layer made of a semiconductor material having a band gap greater than that of the active layer is formed on the cavity end facet from which the laser light is emitted, so as to have a sufficient thickness to prevent local generation of crystal defects by lattice mismatching between the semiconductor material of the window layer and the semiconductor materials at the cavity end facet.

In a preferred embodiment, the window layer has a thickness of 0.2 nm to 3 $\mu$m. More preferably, the window layer has a thickness of 0.2 nm to 2 $\mu$m.

In a preferred embodiment, the window layer has a band gap greater than that of the active layer by at least 300 meV.

In a preferred embodiment, the band gap of the window layer is greater than that of the cladding layers.

In a preferred embodiment, the window layer is covered with an insulating film so that the reflectivity of at least one of the cavity end facets becomes 5 to 20%.

In a preferred embodiment, the waveguide within the active layer has a uniform width.

In a preferred embodiment, the width of the waveguide within the active layer is smaller in the cavity portion near the end facets and greater in the center portion other than these end portions.

In a preferred embodiment, the semiconductor materials are selected from the group consisting of AlGaAs, InGaAlP, and a mixture of AlGaAs and InGaAlP.

In a preferred embodiment, a protective layer is formed on the surface of the window layer, the protective layer having a band gap different from that of the window layer.

In a preferred embodiment, a protective layer which is a sulfur-containing film is formed on the surface of the window layer.

In a more preferred embodiment, the protective layer is covered with an insulating film so that the reflectivity of at least one of the cavity end facets becomes 5 to 20%.

The method for producing a semiconductor laser device of this invention which emits laser light from an end facet thereof and not only has an active layer for laser oscillation but also has a semiconductor layer with a band gap greater than that of the active layer, which is formed on the end facet, comprises the steps of: cleaving a semiconductor laser wafer to form a plurality of bar-shaped wafers having a width which is substantially equivalent to a cavity length; and fixing the bar-shaped wafers in a supporting jig and then introducing it into a growth chamber for vapor phase epitaxy to grow the semiconductor layer at least on the cleavage planes of the bar-shaped wafers.

In a preferred embodiment, the bar-shaped wafers are fixed by a fixing jig together with the supporting jig.

In a preferred embodiment, the supporting jig is formed from a material such as carbon, PBN, quartz, GaAs, Si or InP, or any combination thereof.

Thus, the invention described herein makes possible the objectives of (1) providing a semiconductor laser device in which a window layer made of a semiconductor material having a band gap greater than that of an active layer is formed on the light-emitting facet and the window layer has a sufficient thickness to prevent local generation of crystal defects that are caused by lattice mismatching between the semiconductor material of the window layer and the semiconductor material at the cavity end facet, thereby attaining high reliability even when operated at a high output power level for a long period of time; (2) providing a semiconductor laser device which can attain laser oscillation with a laser beam having a small ellipticity, so that it can be used very preferably as a light source for optical pickup apparatuses; (3) providing a simple method for producing such a semiconductor laser device having excellent characteristics, in which the growth of a semiconductor layer having a greater band gap than that of the active layer on the light-emitting facet is conducted by the use of a jig for fixing laser bars, so that the laser bars can readily be carried and can certainly be fixed at the respective positions, thereby attaining high controllability of the growth of the semiconductor layer on the light-emitting facet; and (4) providing a simple method for producing a semiconductor laser device with high yield, which can attain high reliability even when operated at an optical output power level of 50 to 150 mW for a long period of time.

BRIEF DESCRIPTION OF THE DRAWINGS

This invention may be better understood and its numerous objectives and excellent advantages will become apparent to those skilled in the art by reference to the accompanying drawings as follows:

FIG. 13 is a graph showing the current-optical output power characteristics of the semiconductor laser device of FIG. 12 having window layers and of a conventional semiconductor laser device having no window layers.

FIG. 14A is a graph showing the far-field pattern of the semiconductor laser device of FIG. 12 having window layers.

FIG. 14B is a graph showing the far-field pattern of a conventional semiconductor laser device having no window layers.

FIGS. 27A and 27B are perspective views showing another production method of the semiconductor laser device of FIG. 25.

DESCRIPTION OF THE PREFERRED EMBODIMENTS

The invention will be further explained with reference to the following examples.

EXAMPLE 1

Figure 1:
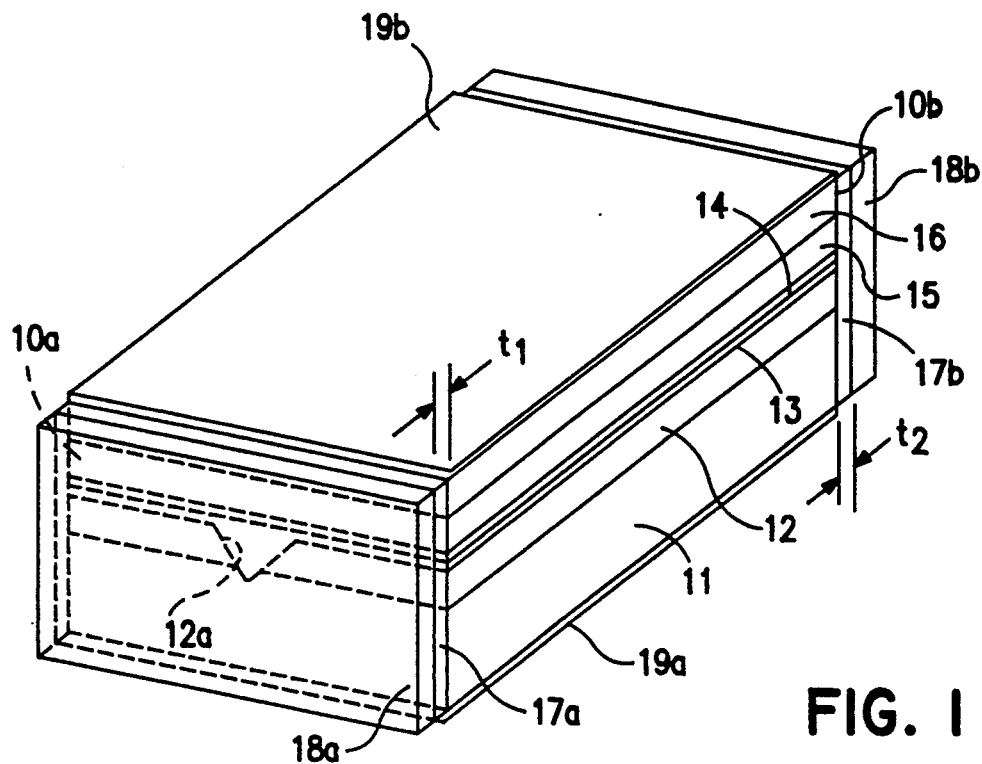
FIG. 1 is a perspective view of a semiconductor laser device of this invention.
Figure 2:
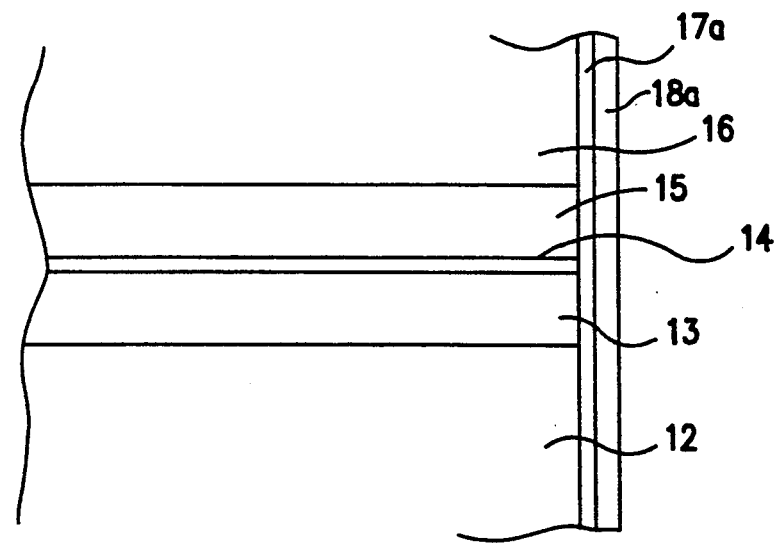
FIG. 2 is a fragmentary sectional view of the front facet portion of the semiconductor laser device of FIG. 1.

FIG. 1 shows a semiconductor laser device of this invention. In particular, the front facet portion of this semiconductor laser device is shown in FIG. 2. As shown in FIG. 1, the semiconductor laser device of this example has a VSIS structure which is described in detail by, for example, S. Yamamoto et al., Applied Physics Letters, vol. 40, No. 5, pp. 372-374 (1982). The semiconductor laser device of FIG. 1 is produced as follows.

First, on a p-GaAs substrate 11, an n-GaAs current blocking layer 12 is grown by liquid phase epitaxy. Through this current blocking layer 12, a V-striped channel 12a is formed so as to reach into the substrate 11 by photolithography and chemical etching. Then, a p-$Al_yGa_{1-y}As$ cladding layer 13 is grown so as to fill in the V-striped channel 12a by liquid phase epitaxy. The cladding layer 13 is further grown so as to make the surface flat over the current blocking layer 12 after filling in the V-striped channel 12a. On the cladding layer 13, a p-$Al_xGa_{1-x}As$ ($x \leq y$) active layer 14, an n-$Al_yGa_{1-y}As$ cladding layer 15, and an n-GaAs contact layer 16 are successively grown in this order.

The wafer thus obtained is then cleaved to form a pair of cavity end facets 10a and 10b which are respectively positioned at both ends in the longitudinal direction of the V-striped channel 12a.

On the cavity end facets 10a and 10b, highly-resistive $Al_zGa_{1-z}As$ window layers 17a (thickness $t_1$) and 17b (thickness $t_2$) each having a carrier concentration of $10^{17}$ cm$^{-3}$ or less are grown by metal organic chemical vapor deposition along the longitudinal direction of the V-striped channel 12a, respectively. The Al mole fraction z of the window layers 17a and 17b is greater than the Al mole fraction x of the active layer 14, so that the band gap of the window layers 17a and 17b is also greater than that of the active layer 14. In this example, the thicknesses $t_1$ and $t_2$ of the window layers 17a and 17b are set to be equal to each other, that is, $t_1 = t_2$.

On the bottom face of the p-GaAs substrate 11 and the upper face of the n-GaAs contact layer 16, p-sided electrode 19a and n-sided electrode 19b are formed, respectively.

Finally, on the highly-resistive $Al_zGa_{1-z}As$ window layer 17a formed on the cavity end facet 10a, as shown in FIG. 2, an $Al_2O_3$ dielectric film 18a is grown to adjust the reflectivity of the cavity end facet 10a to, for example, 15%. On the high-resistive $Al_zGa_{1-z}As$ window layer 17b formed on the other cavity end facet 10b, a multi-layered film 18b composed of $Al_2O_3$ dielectric films and silicon films is grown to adjust the reflectivity of the cavity end facet 10b to, for example, 95%.

The semiconductor laser device obtained in this way is mounted on a heat sink and operated by injecting a current in the active layer 14 sandwiched between the cladding layers 13 and 15 through the p-sided electrode 19a and n-sided electrode 19b. The active layer 14 has a smaller Al mole fraction than that of the cladding layers 13 and 15, so that laser light is excited within the active layer 14 by recombination. Thus, the excited laser light is emitted from the cavity end facet 10a as the light-emitting facet, on which the $Al_2O_3$ dielectric film 18a is formed to adjust the reflectivity to 15%.

As described above, the highly-resistive $Al_zGa_{1-z}As$ window layers 17a and 17b are formed by metal organic chemical vapor deposition on the cavity end facets 10a and 10b, respectively. Therefore, between the window layers 17a and 17b and the underlying semiconductor layers at the respective cavity end facets 10a and 10b, a satisfactory interface is formed and there are generated no non-radiative recombination centers. Moreover, the window layers 17a and 17b have a greater Al mole fraction than that of the active layer 14, so that the band gap of the window layers 17a and 17b is also greater than that of the active layer 14. Therefore, there is no light absorption in the window layers 17a and 17b and there is also no heat generation, thereby preventing the deterioration of the cavity end facets.

There is a possibility that the highly-resistive $Al_zGa_{1-z}As$ window layers 17a and 17b formed on the respective cavity end facets 10a and 10b have some strain to generate crystal defects depending not only upon a difference in the lattice constants between the window layers 17a and 17b and the underlying semiconductor layers at cavity end facets 10a and 10b, but also upon the thicknesses $t_1$ and $t_2$ of the window layers 17a and 17b.

When the window layers 17a and 17b have a small thickness, the strain in the window layers 17a and 17b is reduced and therefore crystal defects are not generated. However, when the window layers 17a and 17b have a great thickness, crystal defects are generated by the influence of the strain. The thickness $t_1$ and $t_2$ of the window layers 17a and 17b such that crystal defects are generated can be estimated by lattice constants of the crystal constituting the window layers 17a and 17b.

The situation in which the underlying $Al_xGa_{1-x}As$ active layer 14 or $Al_yGa_{1-y}As$ cladding layers 13 and 15 the $Al_zGa_{1-z}As$ window layers 17a and 17b are affected to have some strain, depends not only upon the difference between the Al mole fraction x of the active layer 14 and the Al mole fraction z of the window layers 17a and 17b but also the difference between the Al mole fraction y of the cladding layers 13 and 15 and the Al mole fraction z of the window layers 17a and 17b. On a semiconductor layer exhibiting a great difference in the Al mole fraction, the crystal constituting the window layers 17a and 17b is grown to have some strain. Therefore, in a semiconductor laser device where the Al mole fraction x of the active layer 14 is smaller than or equal to the Al mole fraction y of the cladding layers 13 and 15 (i.e., $x \leq y$), and also where the Al mole fraction z of the window layers 17a and 17b is greater than or equal to the Al mole fraction x of the active layer 14 (i.e., $z \geq x$), the relationship $(z-x) \geq (z-y)$ is always satisfied and therefore the window layers 17a and 17b have some strain on the active layer 14 exhibiting a greater difference in the Al mole fraction, if the Al mole fraction z of the window layers 17a and 17b is greater than or equal to the average $\{(x+y)/2\}$ of the Al mole fractions x of the active layer 14 and the Al mole fraction y of the cladding layers 13 and 15. In contrast, if the Al mole fraction z of the window layers 17a and 17b is smaller than or equal to the average $\{(x+y)/2\}$ of the Al mole fractions x of the active layer 14 and the Al mole fraction y of the cladding layers 13 and 15, the relationship $(z-y) \geq (z-x)$ is always satisfied and therefore the window layers 17a and 17b have some strain on the cladding layers 13 and 15 exhibiting a greater difference in the Al mole fraction.

For example, when the Al mole fraction x of the $Al_xGa_{1-x}As$ active layer 14 is 0.15 and the Al mole fraction y of the $Al_yGa_{1-y}As$ cladding layers 13 and 15 is 0.45 (therefore, the average of both being equal to 0.3), the window layers 17a and 17b have some strain on the active layer 14 exhibiting a greater difference in the Al mole fraction with respect to the window layers 17a and 17b, if the Al mole fraction z of the $Al_zGa_{1-z}As$ window layers 17a and 17b is 0.5 ($\geq 0.3$). In contrast, if the Al mole fraction z of the $Al_zGa_{1-z}As$ window layers 17a and 17b is 0.2 ($\leq 0.3$), the window layers 17a and 17b have some strain on the cladding layers 13 and 15 exhibiting a greater difference in the Al mole fraction with respect to the window layers 17a and 17b.

According to H. C. Casey, Jr. and M. B. Panish, Heterostructure Lasers (1978), the lattice constant of GaAs (expressed by a(GaAs) below) and the lattice constant of $Al_xGa_{1-x}As$ (expressed by $a(Al_xGa_{1-x}As)$ below) are 0.565325 nm and (0.565325+0.000725x) nm (where x denotes the Al mole fraction of $Al_xGa_{1-x}As$), respectively. When an $Al_zGa_{1-z}As$ semiconductor layer is regrown on an $Al_xGa_{1-x}As$ crystal, the thickness h at which crystal defects are generated in the $Al_zGa_{1-z}As$ semiconductor layer is expressed by the following equation I, as described in J. M. Wooall et al., Physical Review Letters, vol. 51, No. 19, pp. 1783 (1983).

$$h = (\text{average lattice constant of } Al_xGa_{1-x}As \text{ and } Al_zGa_{1-z}As)^2 / |a(Al_xGa_{1-x}As) - a(Al_zGa_{1-z}As)| \quad (I)$$

Figure 3:
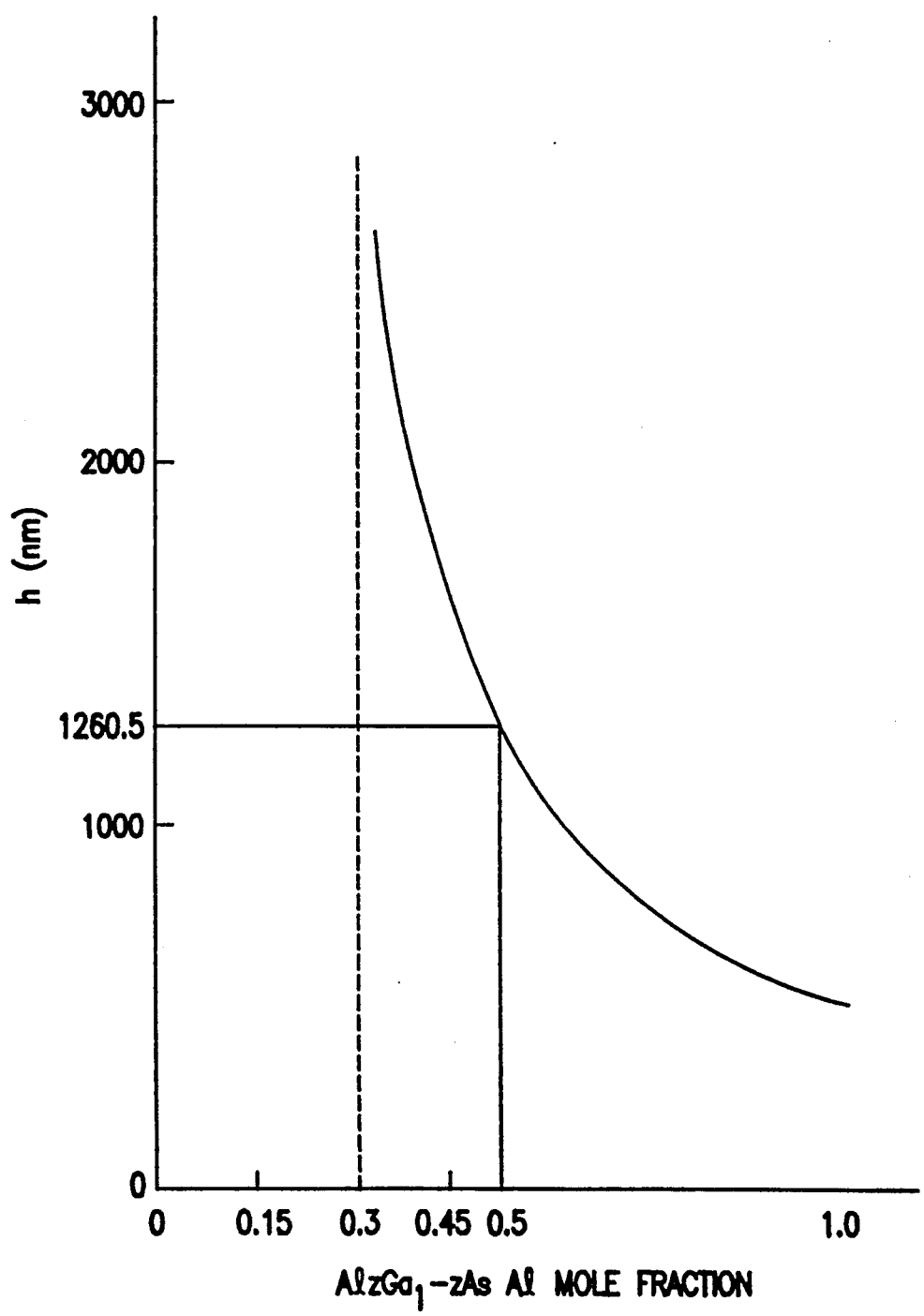
FIG. 3 is a graph showing the relationship between the Al mole fraction and the thickness of the window layer of the semiconductor laser device of FIG. 1.

As described above, when the Al mole fraction x of the active layer 14 is 0.15 and the Al mole fraction y of the cladding layers 13 and 15 is 0.45 (therefore, the average of both being equal to 0.3), the window layers 17a and 17b have some strain on the active layer 14, if the Al mole fraction z of the window layers 17a and 17b is 0.3 or more. FIG. 3 shows the relationship obtained by equation I, between the Al mole fraction z of the $Al_zGa_{1-z}As$ window layer 17a and 17b and the thickness h of the window layers 17a and 17b at which crystal defects are generated therein. As can be seen from this figure, when the Al mole fraction z is 0.5, the window layers 17a and 17b have crystal defects, if the thickness thereof is 1260.5 nm or more. If the window layers 17a and 17b have a thickness smaller than 1260.5 nm, the generation of crystal defects can be reduced.

Figure 4:
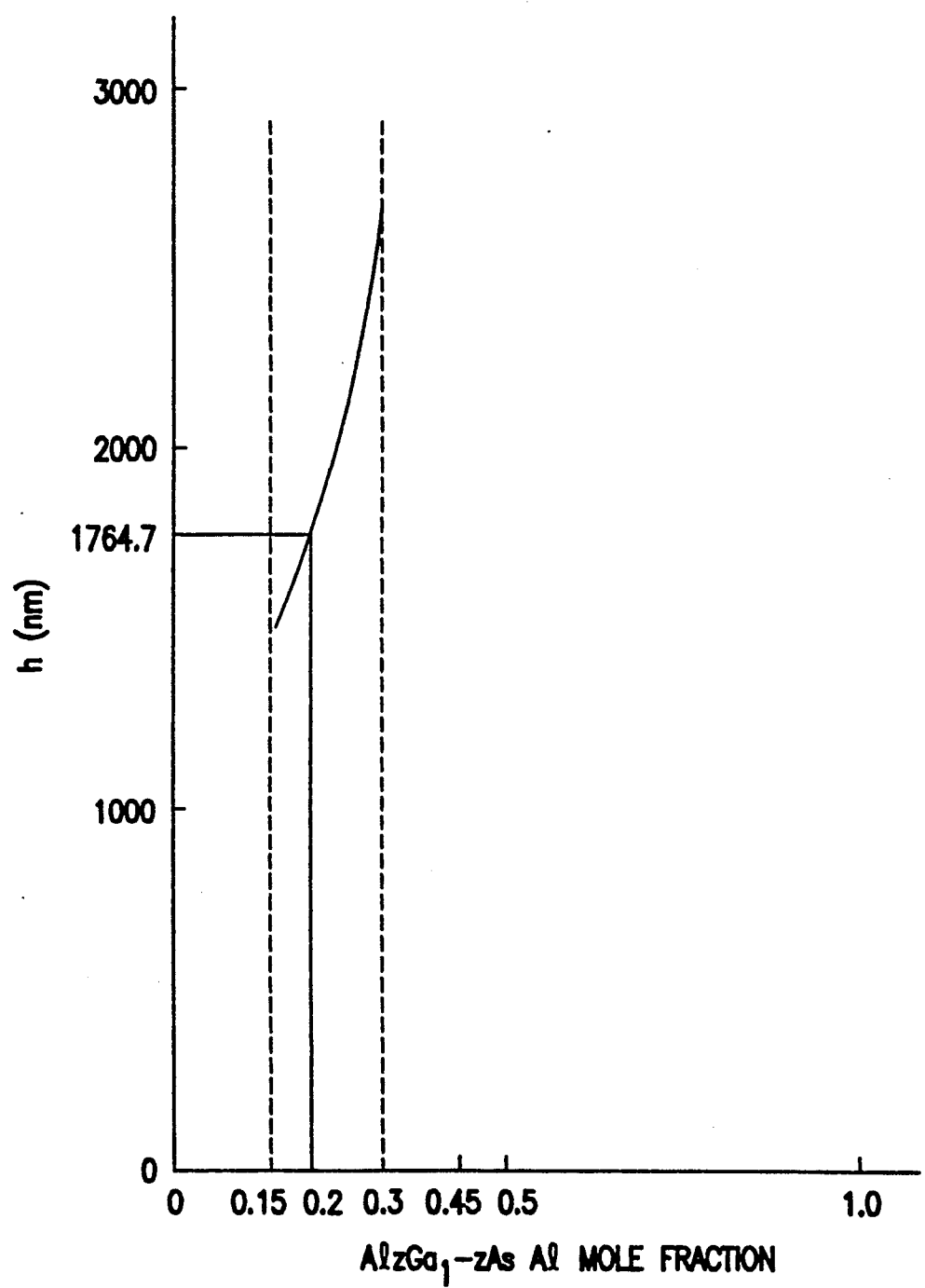
FIG. 4 is another graph showing the relationship between the Al mole fraction and the thickness of the window layer of the semiconductor laser device of FIG. 1.

On the other hand, if the Al mole fraction z of the $Al_zGa_{1-z}As$ window layers 17a and 17b is 0.3 or less, the window layers 17a and 17b have some strain on the cladding layers 13 and 15. FIG. 4 shows the relationship obtained by equation I, between the Al mole fraction z of the $Al_zGa_{1-z}As$ window layer 17a and 17b and the thickness h of the window layers 17a and 17b at which crystal defects are generated therein. As can be seen from this figure, when the Al mole fraction z is 0.2, the window layers 17a and 17b have crystal defects, if the thickness thereof is greater than 1764.7 nm. If the window layers 17a and 17b have a thickness smaller than 1764.7 nm, the generation of crystal defects can be reduced.

When the active layer 14 and the cladding layers 13 and 15 have the respective thickness as described above, as seen from FIGS. 3 and 4, the maximum thickness of the window layers 17a and 17b is 3,000 nm, regardless of the value of the Al mole fraction z.

The respective thicknesses $t_1$ and $t_2$ of the window layers 17a and 17b are set so as to satisfy the above-mentioned conditions, based on the Al mole fraction z. The thicknesses $t_1$ and $t_2$ can be equal to each other, and can also be different from each other, so long as crystal defects are not generated in the window layers 17a and 17b.

Figure 5:
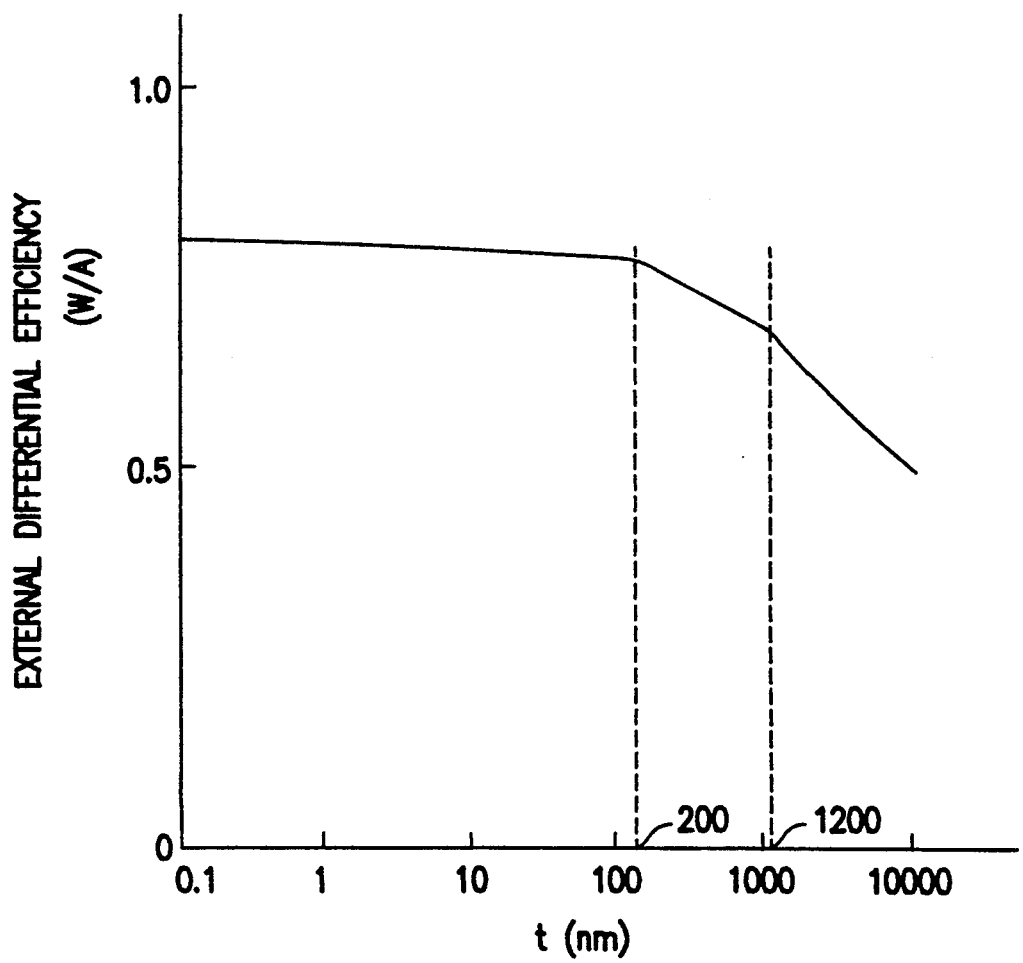
FIG. 5 is a graph showing the relationship between the thickness of the window layer and the external differential efficiency of the semiconductor laser device of FIG. 1.

The following will describe the dependence of device characteristics on the thicknesses $t_1$ and $t_2$ of the window layers 17a and 17b, when the Al mole fraction z of the window layers 17a and 17b is 0.5. FIG. 5 shows the change in external differential efficiency with a variation in the thicknesses $t_1$ and $t_2$ of the window layers 17a and 17b. If the thicknesses $t_1$ and $t_2$ are about 1,200 nm or more, the efficiency rapidly decreases. This is because the window layers 17a and 17b have some strain in the vicinity of the active layer 14 and the cladding layers 13 and 15 to generate crystal defects, so that laser light is scattered to increase an optical loss. In contrast, if the thicknesses $t_1$ and $t_2$ are about 1,200 nm or less, satisfactory efficiency is obtained. This is because the strain in the window layers 17a and 17b can be reduced, so that there are few crystal defects. In particular, if the thicknesses $t_1$ and $t_2$ are about 200 nm or less, crystal defects are significantly decreased, thereby obtaining more satisfactory efficiency.

Figure 6:
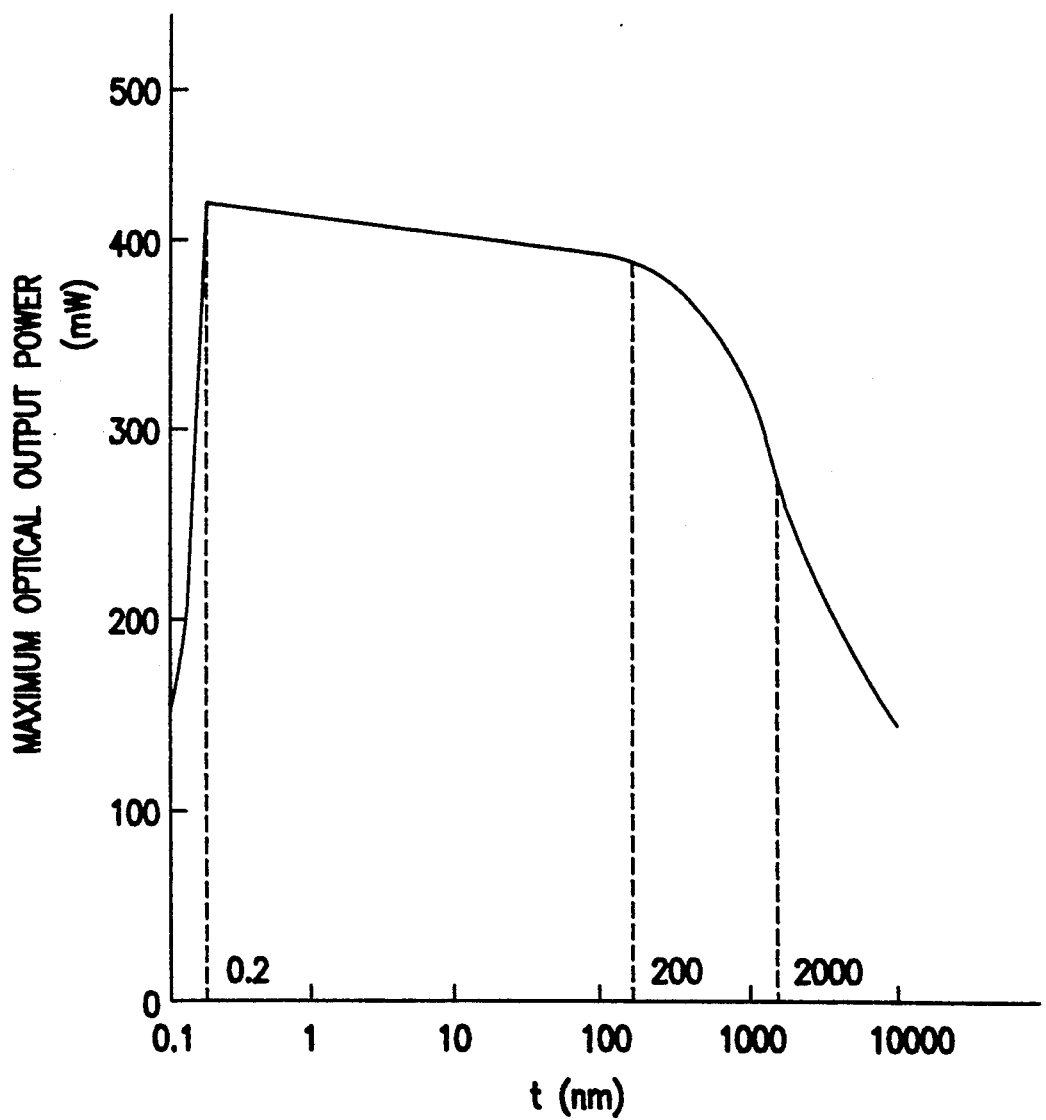
FIG. 6 is a graph showing the relationship between the thickness of the window layer and the maximum optical output power of the semiconductor laser device of FIG. 1.

FIG. 6 shows the change in maximum optical output power of an oscillated laser with a variation in the thicknesses $t_1$ and $t_2$ of the window layers 17a and 17b. If the thicknesses $t_1$ and $t_2$ are about 2,000 nm or more, the window layers 17a and 17b have some strain and therefore crystal defects are generated, so that the degree of non-radiative recombination caused by crystal defects is increased and the maximum optical output power is decreased. If the thicknesses $t_1$ and $t_2$ are smaller than about 0.2 nm, these thicknesses are smaller than the molecular size of $Al_{0.5}Ga_{0.5}As$ crystal in the window layers 17a and 17b, so that the window layers 17a and 17b do not have the properties of an $Al_{0.5}Ga_{0.5}As$ molecule and the cavity end facets exhibit the same characteristics as those obtained when the window layers 17a and 17b are not formed thereon. In contrast, if the thicknesses $t_1$ and $t_2$ are in the range of about 0.2 to 2,000 nm, the maximum optical output power of 300 mW can be obtained. In particular, if the thicknesses $t_1$ and $t_2$ are about 0.2 nm or less, not only the maximum optical output power of 400 mW can be obtained, but also the deterioration of end facets does not occur and the optical output power is saturated by heat.

Figure 7:
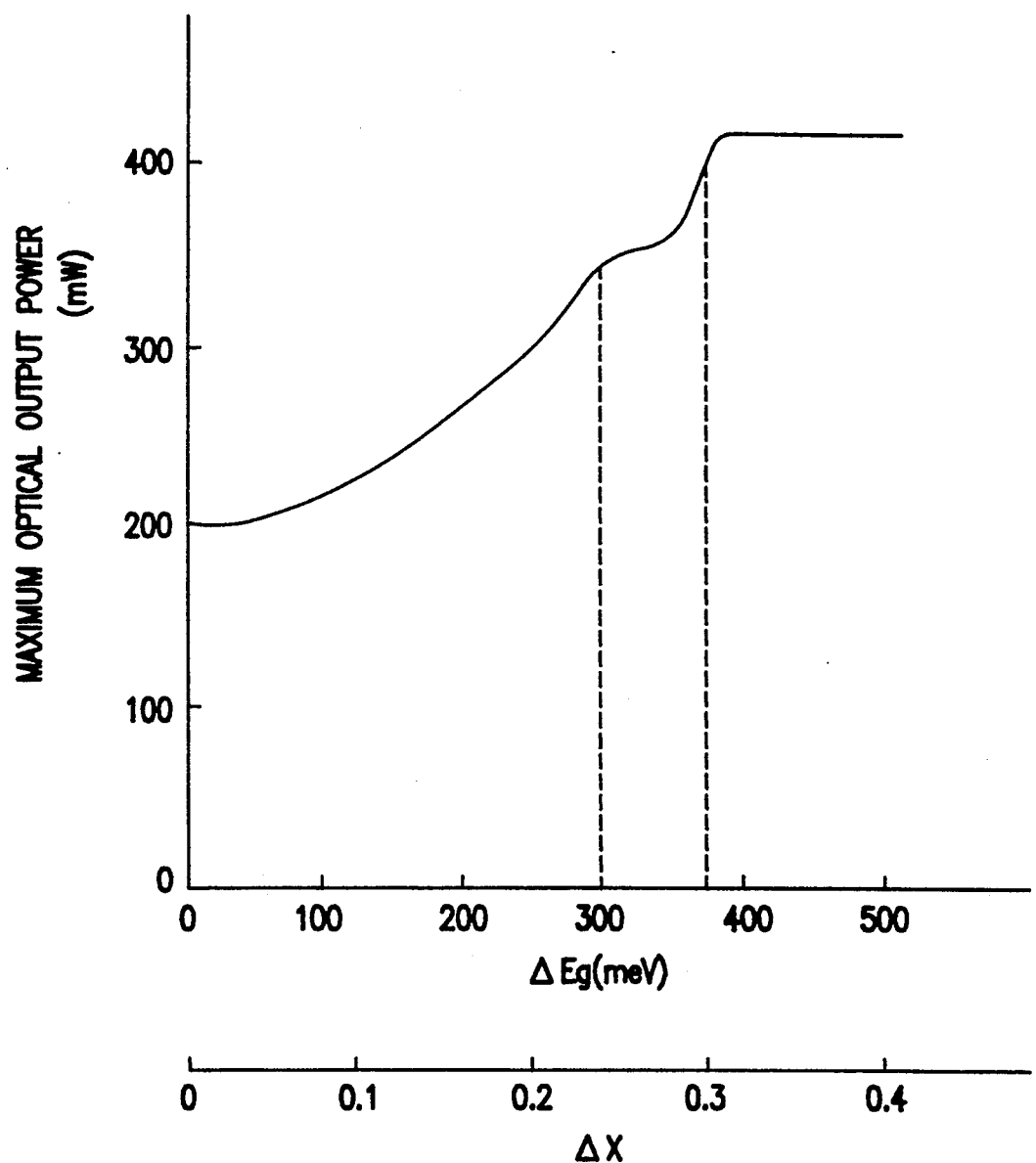
FIG. 7 is a graph showing the relationship between the band gap difference or Al mole fraction difference between the window layer and the active layer, and the maximum optical output power of the semiconductor laser device of FIG. 1.

The band gap of the window layers 17a and 17b is set to be greater than that of the active layer 14. The difference in band gap between the active layer 14 and the window layers 17a and 17b is correlated with the maximum optical output power. FIG. 7 shows the relationship between the band gap difference $\Delta E_g$ between the active layer 14 and the window layers 17a and 17b or the corresponding difference $\Delta X$ in the Al mole fraction therebetween, and the maximum optical output power. As can be seen from this figure, when $\Delta E_g$ is 300 meV or more, the maximum optical output power is improved up to 350 mW or more. In particular, when the band gap of the window layers 17a and 17b is greater than or equal to that of the cladding layers 13 and 15, the maximum optical output power is improved up to 400 mW. This corresponds to the case where x=0.15, y=0.45, z>y, and therefore, $\Delta X = z - x \geq 0.3$. When $\Delta E_g$ is 300 meV or less, because the difference in band gap between the active layer 14 and the window layers 17a and 17b is too small, carriers injected in the active layer 14 overflow into the window layers 17a and 17b, so that a leakage current flows through the window layers 17a and 17b. The leakage current causes heat generation, thereby decreasing the maximum optical output power. When the band gap of the window layers 17a and 17b is smaller than that of the cladding layer 13 and 15, for example, when $\Delta X < 0.3$, carriers overflow from the cladding layers 13 and 15 into the window layers 17a and 17b, so that a leakage current flows through the window layers 17a and 17b, thereby decreasing the optical output power. Therefore, when the band gap of the window layers 17a and 17b is 300 meV or more, the effect of improving the maximum optical output power becomes increased. In particular, when the band gap of the window layers 17a and 17b is greater than that of the cladding layers 13 and 15, this effect becomes further increased.

Figure 8:
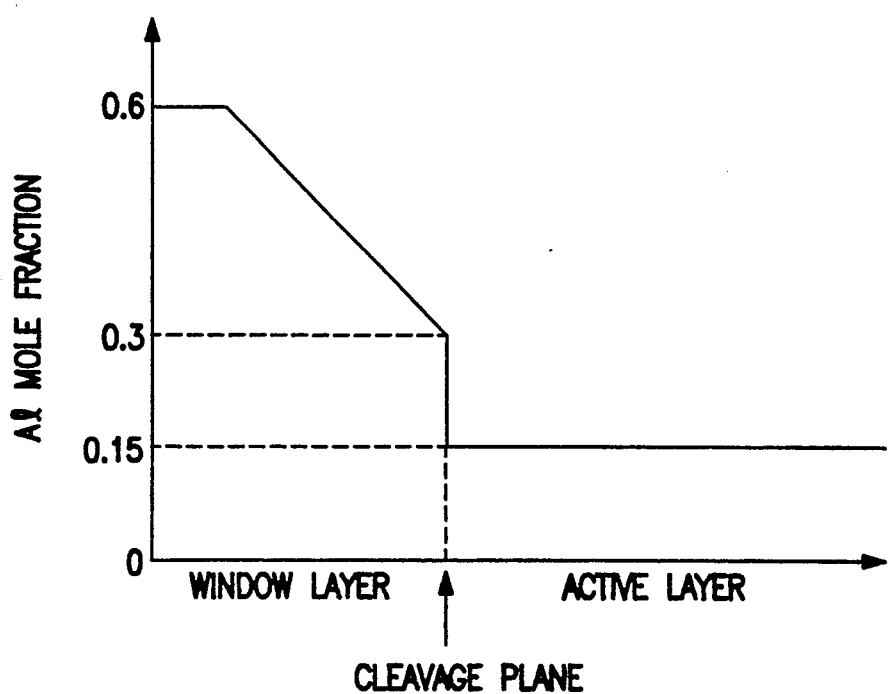
FIG. 8 is a diagram showing the distribution of Al mole fractions when the window layer of the semiconductor laser device of FIG. 1 has a graded-band-gap structure.

In cases where the window layers 17a and 17b have a graded-band-gap structure in which the band gap increases gradually with an increase in the distance from the surface of the cleavage plane, carriers over-flowing into the window layers 17a and 17b are forced to return to the active layer 14, so that the generation of a leakage current can be prevented and the maximum optical output power can be further improved. FIG. 8 shows the change in the Al mole fraction along the cavity direction from the active layer 14 to the window layers 17a and 17b, as one example of the window layers 17a and 17b having a graded-band-gap structure. As seen from this figure, the Al mole fraction of the window layers 17a and 17b increases gradually with an increase in the distance from the surface of the cleavage plane, while the band gap thereof also increases gradually.

Figure 9:
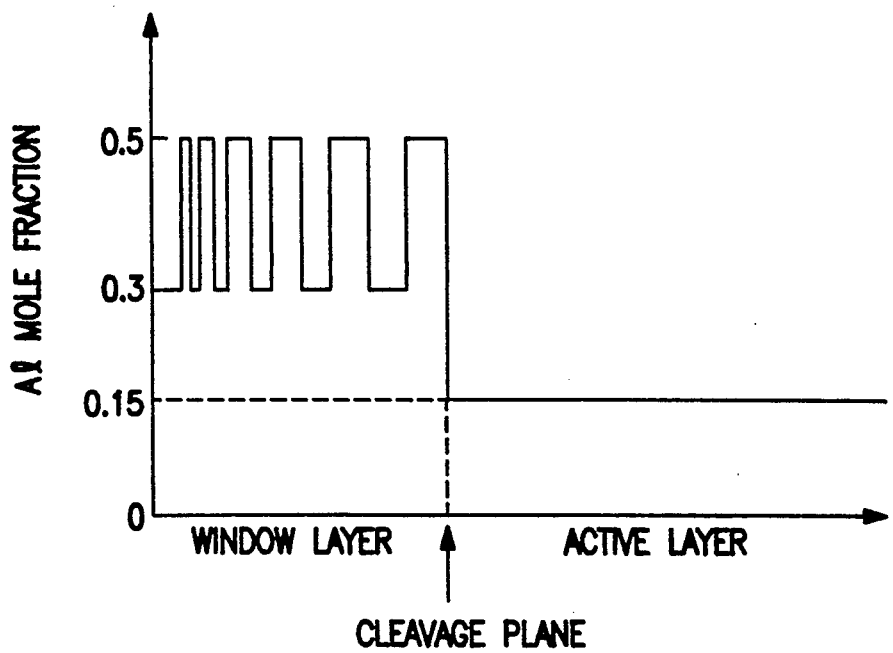
FIG. 9 is a diagram showing the distribution of Al mole fractions when the window layer of the semiconductor laser device of FIG. 1 has a multiquantum barrier structure.

In cases where the window layers 17a and 17b have a multi-quantum barrier structure having different well widths and different barrier widths, carriers overflowing from the active layer 14 into the window layers 17a and 17b are reflected on the multi-quantum barrier and forced to return to the active layer 14, so that the generation of a leakage current can be prevented and the maximum optical output power can be further improved. FIG. 9 shows the change in the Al mole fraction along the cavity direction from the active layer 14 to the window layers 17a and 17b, as one example of the window layers 17a and 17b having a multi-quantum barrier structure. As seen from this figure, the Al mole fraction of the window layers 17a and 17b changes alternatively and the period thereof decreases with an increase in the distance from the surface of the cleavage plane.

EXAMPLE 2

Figure 10:
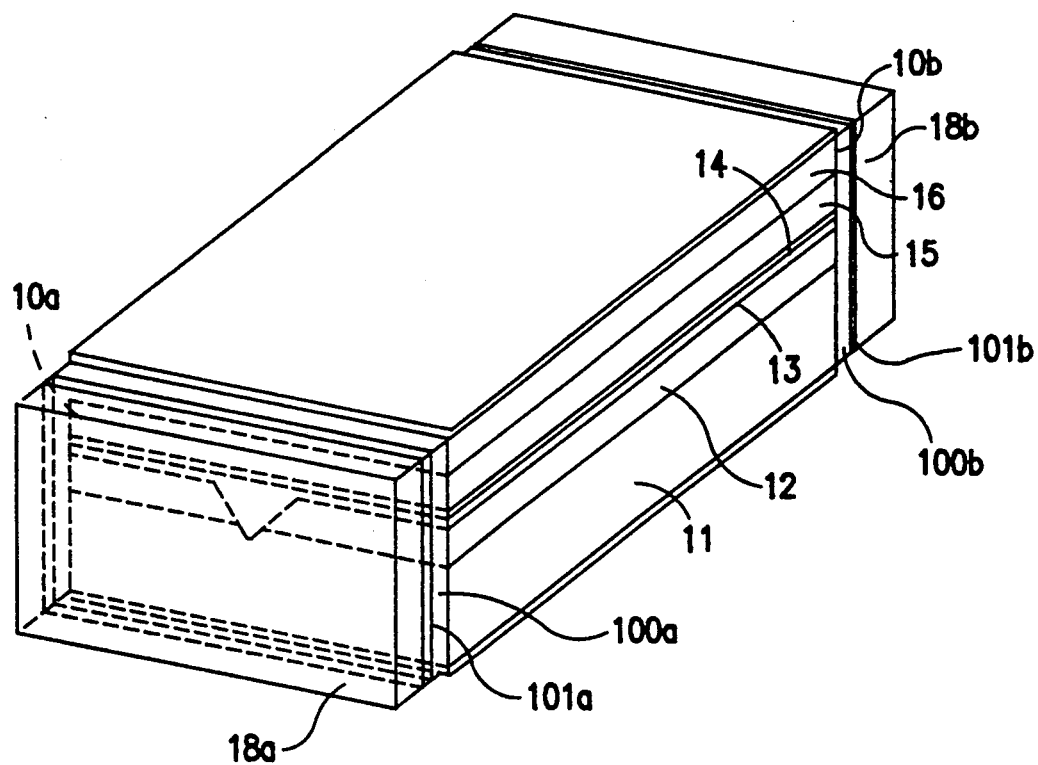
FIG. 10 is a perspective view of another semiconductor laser device of this invention.

FIG. 10 shows another semiconductor laser device of this invention. This semiconductor laser device has a VSIS structure similar to that of the semiconductor laser device of Example 2. On the cavity end facets 10a and 10b, highly-resistive $Al_{0.5}Ga_{0.5}As$ window layers 100a and 100b, as well as $Al_{0.2}Ga_{0.8}As$ protective layers 101a and 101b which are different from the window layers 100a and 100b, are grown by metal organic chemical vapor deposition, respectively. On the protective layers 101a and 101b, an $Al_2O_3$ dielectric film 18a and a multi-layered film 18b composed of $Al_2O_3$ dielectric films and silicon films are formed, respectively. Other portions of the semiconductor laser device of this example are the same as those of the semiconductor laser device of Example 1 shown in FIG. 1, therefore, the description thereof will be omitted for simplicity.

In the semiconductor laser device of this example, the protective layers 101a and 101b which are semiconductor layers having a smaller Al mole fraction than that of the window layers 100a and 100b are provided on the window layers 100a and 100b, respectively. Therefore, the oxidation by air of al components in the protective layers 101a and 101b is reduced, as compared with the case where the window layers 101a and 101b having a greater Al mole fraction are in direct contact with air. As a result, it is possible to prevent the non-radiative combination of carriers overflowing from the active layer 14 or the cladding layers 13 and 15 which is caused by the oxidation of the window layers 100a and 100b, and the semiconductor laser device of this example can attain high reliability even when operated at a high output power level for a long period of time.

Also in this example, if the Al mole fraction y of the cladding layers 13 and 15 is 0.45, the maximum thickness of the window layers 100a and 100b is 3,000 nm, as seen from graphs in FIGS. 3 and 4. The thickness of the window layers 100a and 100b was set to be 100 nm for eliminating crystal defects caused by strain, and the thickness of the protective layers 101a and 101b was set to be 50 nm for preventing the introduction of strain. When the resulting semiconductor laser device was operated under the operational conditions, 50° C. and 100 mW, stable laser oscillation was obtained for 20,000 hours. In contrast, a conventional semiconductor laser device having no window layers 101a and 101b attained stable laser oscillation only for about 8,000 hours.

The protective layers 101a and 101b can also be constituted by a semiconductor material containing no Al components, for example, GaAs. When the protective layers 101a and 101b are made of GaAs, these protective layers have a smaller band gap than that of the active layer and can absorb laser light generated in the active layer. However, if the thickness of the protective layers is set to be 20 nm or less, light absorption by these layers is substantially negligible and the same excellent advantages as those obtained by use of protective layers containing Al components can be attained.

Figure 11:
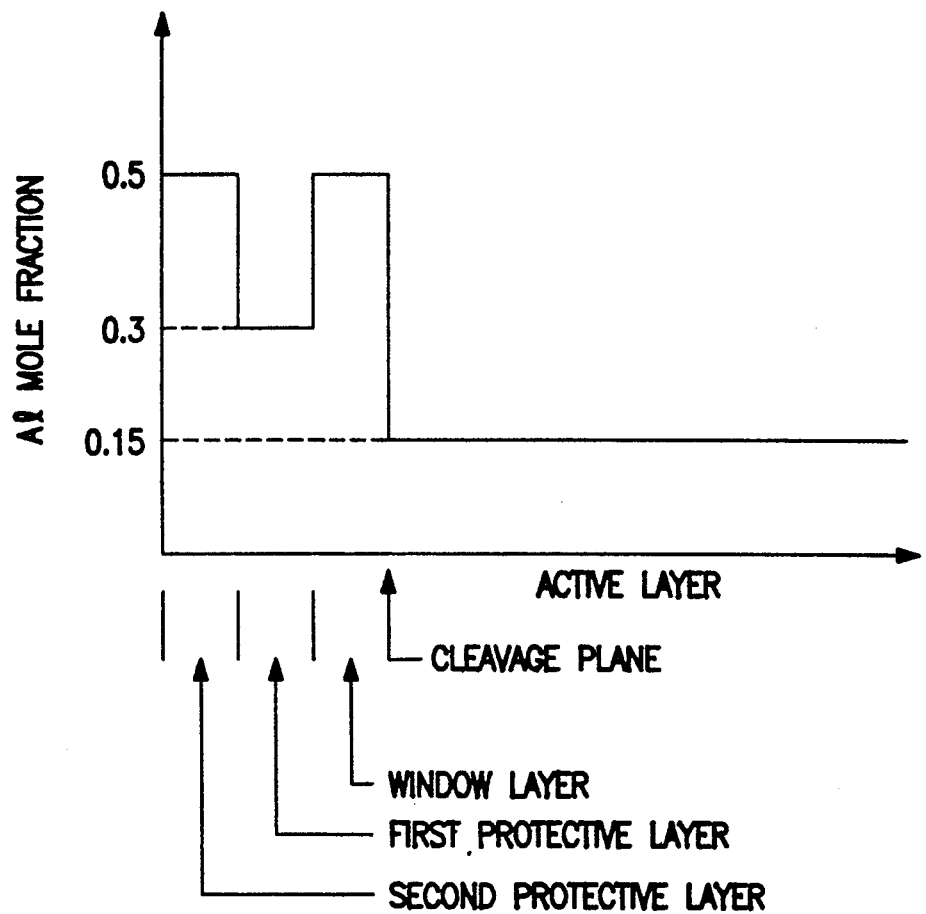
FIG. 11 is a diagram showing the distribution of Al mole fractions when the window layer of the semiconductor laser device of FIG. 10 has a multilayered structure.

Moreover, the protective layers 101a and 101b are not limited to a single layer, and can also have a multi-layered structure in which a semiconductor layer adjacent to the window layers 101a and 101b has a smaller Al mole fraction than that of the window layers and neighboring semiconductor layers have different Al mole fractions from each other. FIG. 11 shows the change in the Al mole fraction from the active layer through the window layer to protective layer, as one example of the multi-layered structure of the protective layers 101a and 101b. The Al mole fraction of the window layer is 0.5, and the Al mole fraction of the protective layer is 0.3 for the first protective layer and 0.5 for the second protective layer. With the use of such a multi-layered protective layer, carriers overflowing from the active layer into the window layer are confined in the first protective layer and are not affected by the oxidation by air of the surface of the protective layer, thereby attaining high reliability for a long period of time.

Furthermore, the protective layers 101a and 101b can also be a sulfur-containing film which is formed, for example, by surface treatment of the window layers 100a and 100b in which after the growth of the window layers 100a and 100b the whole semiconductor laser device is treated in a solution of ammonium sulfide. Also in this case, recombination of carriers in the surface of the window layers can be prevented to attain high reliability for a long period of time. Alternatively, the first protective layer having a smaller Al mole fraction is formed on the surface of the window layers 100a and 100b, and the surface of the first protective layer is then treated to form a sulfur-containing film as the second protective layer. In such a case, the oxidation of the window layers can be reduced, and it is possible to attain high reliability for a further period of time.

EXAMPLE 3

Figure 12:
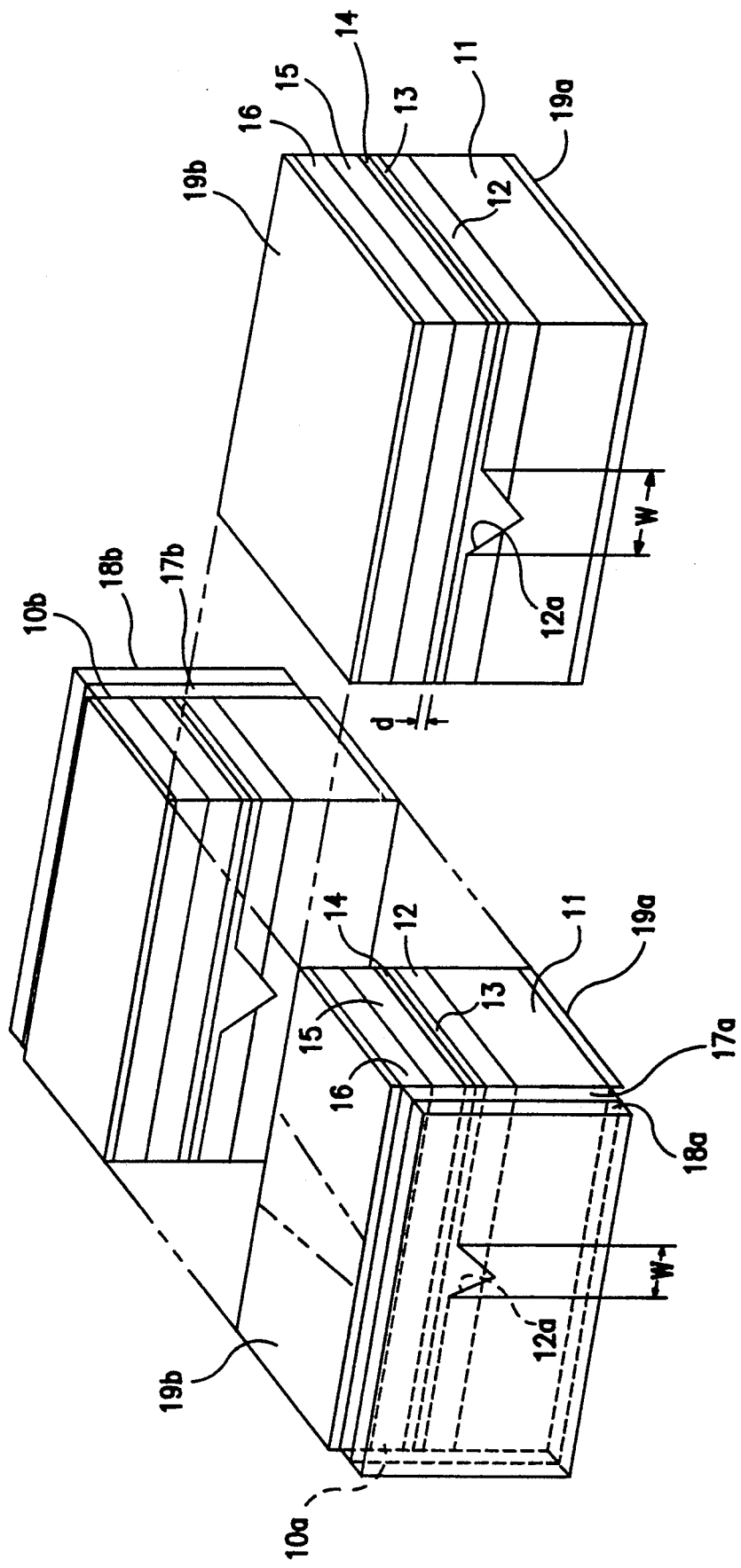
FIG. 12 is a partially cutaway perspective view of still another semiconductor laser device of this invention.

FIG. 12 show a semiconductor laser device of this invention, which can be preferably used in optical pickup apparatuses. This semiconductor laser device has a VSIS structure similar to that of the semiconductor laser device of Example 1 shown in FIG. 1. The width w of the V-striped channel 12a (i.e., the width of the waveguide) at the cavity end facets 10a and 10b is smaller than that of the width W of the V-striped channel in the center portion other than the cavity portions near the end facets 10a and 10b. In the cavity portions near the end facets 10a and 10b, the width of the V-striped channel increases gradually with an increase in the distance from the end facets 10a and 10b. Other portions of the semiconductor laser device of this example are the same as those of the semiconductor laser device of Example 1 shown in FIG. 1, therefore, the same constituent elements are numbered in the same way and the description thereof will be omitted for simplicity.

In the semiconductor laser device of this example, as described in Example 1, the thickness of the window layers 17a and 17b is determined by the Al mole fraction x of the $Al_xGa_{1-x}As$ active layer 14, the Al mole fraction y of the $Al_yGa_{1-y}As$ cladding layers 13 and 15, and the Al mole fraction z of the $Al_zGa_{1-z}As$ window layers 17a and 17b. If the Al mole fraction x of the active layer 14 is 0.15 and the mole fraction y of the cladding layers 13 and 15 is 0.45, the maximum thickness of the window layers 17a and 17b is determined from the graphs shown in FIGS. 3 and 4. The maximum thickness of the window layers 17a and 17b in this case is 3,000 nm, regardless of the value of the Al mole fraction z.

The thickness of the window layers 17a and 17b was set to be 100 nm, and the $Al_2O_3$ dielectric film 18a was formed on the window layer 17a at the end facet of the light-emitting side to have an appropriate thickness, so that the transmittance of the dielectric film 18a was set to be around 15% which is suitable for semiconductor laser devices used in optical disc driving units. The reflectivity of the multi-layered film 18b at the other end facet was set to be 60% to 95%. The dielectric film 18a and the multi-layered film 18b are formed concurrently in a growth apparatus without exposing the device to air after the growth of the window layers on the end facets.

FIG. 13 shows the current-optical output power characteristics of the semiconductor laser device of this example having window layers 17a and 17b (solid line), and of a conventional semiconductor laser device having no window layers 17a and 17b (broken line). FIG. 14A is a graph showing the far-field pattern of the semiconductor laser device of this example, while FIG. 14B is a graph showing the far-field pattern of the conventional semiconductor laser device.

As shown by the broken line in FIG. 13, the conventional semiconductor laser device having no window layers 17a and 17b was broken by melting of the light-emitting facet at an output power level of 150 mW. In contrast, the semiconductor laser device of this example having window layers 17a and 17b attained stable laser oscillation up to an optical output power level of 400 mW, leading to a thermal saturation. Thus, the window layer 17a formed on the light-emitting facet can eliminate non-radiative recombination centers on the light emitting end facet and protect the light-emitting facet satisfactorily. The semiconductor laser device of this example attained stable laser oscillation under the conditions, 50° C. and 100 mW, for 8,000 hours or more, and attained extremely high reliability.

From the result of the far-field pattern measurements shown in FIGS. 14A and 14B, it was found that the ellipticity of 1.9 was achieved in either case, regardless of the presence or absence of the window layer 17a.

Figure 15:
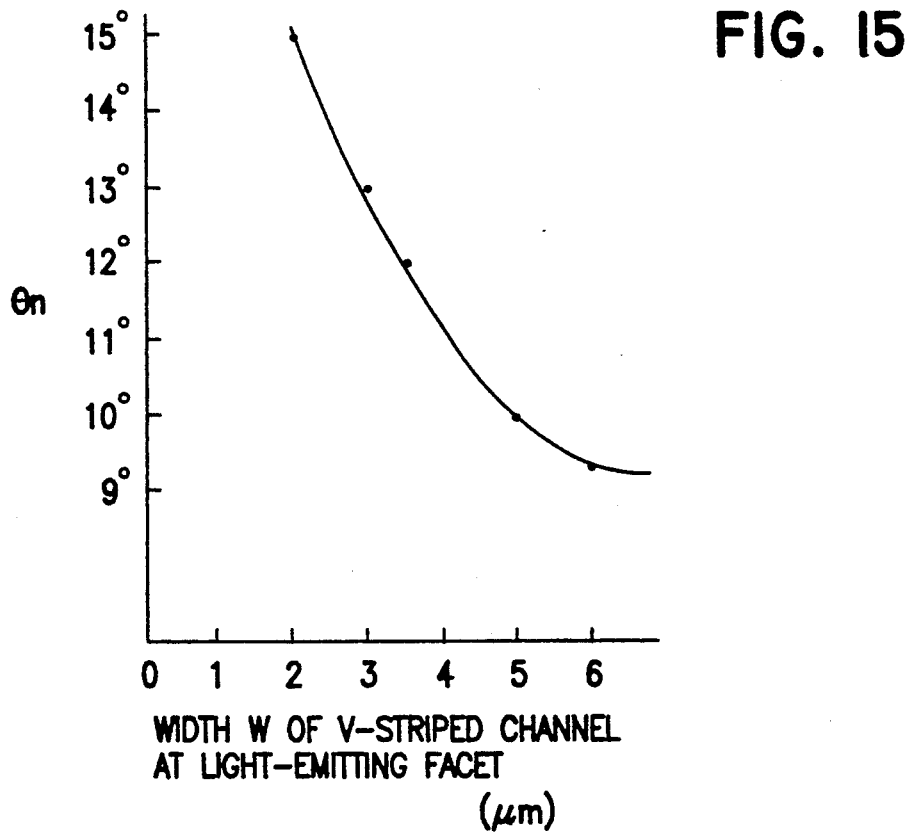
FIG. 15 is a graph showing the relationship between the width of the V-striped channel at the light-emitting facet and the vertical far-field pattern of the semiconductor laser device of FIG. 12.

In the semiconductor laser device shown in FIG. 12, the half-value width $\theta_h$ of the horizontal far-field pattern when the width w of the V-striped channel at the light-emitting facet is varied is 12° or more, if the value of w is 3,500 nm or less, as shown in FIG. 15. In general, when the thickness d of the active layer 14 is set to be around 50 nm, semiconductor laser devices having a VSIS structure in which the half-value width $\theta_v$ of the vertical far-field pattern is 24° or less can be obtained with extremely high probability. Therefore, if the value of w is set to be 3,500 nm or less, semiconductor laser devices having an ellipticity ($\theta_v/\theta_h$) of 2 or less can be produced with high yield.

In this example, although the current blocking layer 12 is made of n-GaAs, a single layer structure of n-$Al_nGa_{1-n}As$ (0<n<x) or a double-layered structure composed of n-GaAs and n-$Al_nGa_{1-n}As$ can also used, in which it is possible to prevent the deformation of the V-striped channel 12a due to its etching back in the second growth by liquid phase epitaxy, so that the width of the V-striped channel 12a can readily be controlled.

Figure 16:
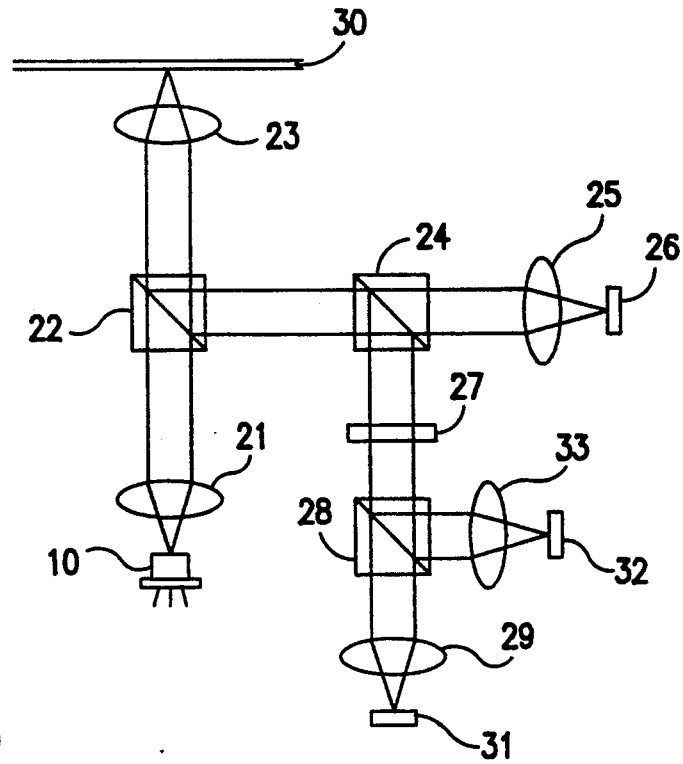
FIG. 16 is a schematic diagram showing the structure of an optical pickup apparatus using the semiconductor laser device of FIG. 12.

The semiconductor laser device of this example is preferably used in an optical pickup apparatus. FIG. 16 shows the schematic structure of an optical pickup apparatus using the semiconductor laser device of this example.

The laser beam emitted from the semiconductor laser device 10 is transmitted through a collimator lens 21 and introduced into a first beam splitter 22. The laser beam incident on the first beam splitter 22 is split into two beams, that is, a beam incident on an optical disc 30 through an objective lens 23 after passing directly through the first beam splitter 22, and a beam refracted by the first beam splitter 22 at right angles. The laser beam refracted by the first beam splitter 22 is introduced into a second beam splitter 24 and split into two beams, that is, a beam passing directly through the second beam splitter 24, and a beam refracted by the second beam splitter 24 at right angles. The laser beam passing directly through the second beam splitter 24 is introduced into a detector 26 for detecting focus error signals through a cylindrical lens 25, and focus error signals are detected by the detector 26. The laser beam refracted by the second beam splitter 24 at right angles is introduced into a third beam splitter 28 through a half-wavelength plate 27. The laser beam incident on the third beam splitter 28 is also split into two beams, that is, a beam passing directly through the third beam splitter 28, and a beam refracted by the third beam splitter 28 at right angles. The laser beam passing directly through the third beam splitter 28 is introduced into a first detector 31 for detecting polarized components through a collimator lens 29. The laser beam refracted by the third beam splitter 28 is introduced into a second detector 32 for detecting polarized components through a collimator lens 33.

In such an optical pickup apparatus, the semiconductor laser device of this example having an ellipticity of 2 or less is used, so that it is unnecessary to use a beam-reshaping prism which has been provided between the first beam splitter 22 and the collimator lens 21 in a conventional optical pickup apparatus. Therefore, the miniaturization of optical pickup apparatuses can be attained and the deviation of a light-converging spot caused by a change in the wavelength of laser light for the conventional optical pickup apparatus using a beam-reshaping prism can be prevented.

EXAMPLE 4

Figure 17:
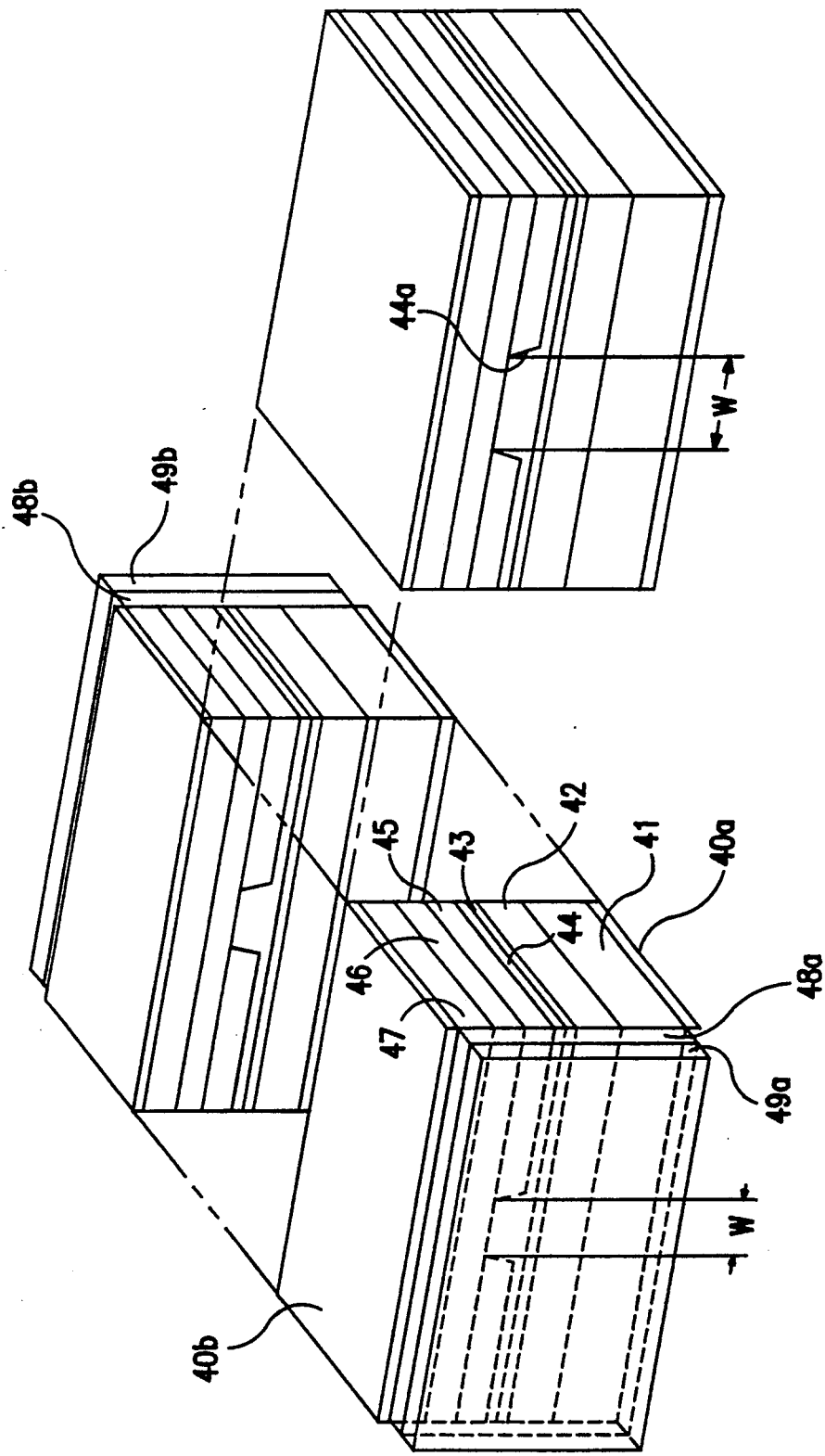
FIG. 17 is a partially cutaway perspective view of still another semiconductor laser device of this invention.

FIG. 17 shows another semiconductor laser device of this invention, which can be preferably used in an optical pickup apparatus. This semiconductor laser device is produced as follows.

First, on an n-GaAs substrate 41, an n-Al$_{0.5}$Ga$_{0.5}$As cladding layer 42, an undoped Al$_{0.15}$Ga$_{0.85}$As active layer 43, and a p-Al$_{0.5}$Ga$_{0.5}$As cladding layer 44 are successively grown by metal organic chemical vapor deposition. The side portions of the p-Al$_{0.5}$Ga$_{0.5}$As cladding layer 44 in the width direction are partially etched to retain the center portion in the width direction as an oscillation region 44a. On the side portions of the cladding layer 44 which have been partially removed, an n-GaAs current confining layer 45 is formed. The surface of the current confining layer 45 and the surface of the cladding layer 44 in the oscillation region 44a are made flat. On these flat surfaces, a p-Al$_{0.5}$Ga$_{0.5}$As cladding layer 46 and a p-GaAs contact layer 47 are successively grown.

Also in this example, the current confining layer 45 functions as a light-absorbing layer, and the waveguide width of the loss-guide type is defined by the width of the current path in the current confining layer 45. The waveguide width is smaller in the cavity portions near the end facets than in the center portion other than the cavity portions near the end facets. For example, the waveguide width w at the end facets is set to be 3,000 nm, whereas the waveguide width W in the center portion other than the cavity portions near the end facets is set to be 5,000 nm. In the cavity portions near the end facets, the waveguide width increases gradually with an increase in the distance from the end facets.

On the back face of the n-GaAs substrate 41, an n-sided electrode 40a is formed, while on the upper face of the p-GaAs contact layer 47, a p-sided electrode 40b is formed.

Finally, on the light-emitting facet, an undoped Al$_{0.6}$Ga$_{0.4}$As window layer 48a is formed to have a thickness of 100 nm, and on the window layer 48a, an Al$_2$O$_3$ dielectric film 49a (reflectivity 12%) is formed. On the other end facet, a similar window layer 48b is formed, and on the window layer 48b, a multi-layered film 49b composed of Al$_2$O$_3$ dielectric films and silicon films is formed to have a reflectivity of 60 to 95%.

The semiconductor laser device of this example attained the maximum optical output power level of 400 mW. Under the conditions, 50° C. and 100 mW, the semiconductor laser device of this example attained stable laser oscillation for 8,000 hours, and exhibited extremely high reliability. Moreover, the horizontal far-field pattern $\theta_h$ was 13° and the vertical far-field pattern $\theta_v$ was 24°, resulting in an ellipticity of 1.8. Therefore, the semiconductor laser device of this example can also be preferably used in an optical pickup apparatus.

EXAMPLE 5

Figure 18:
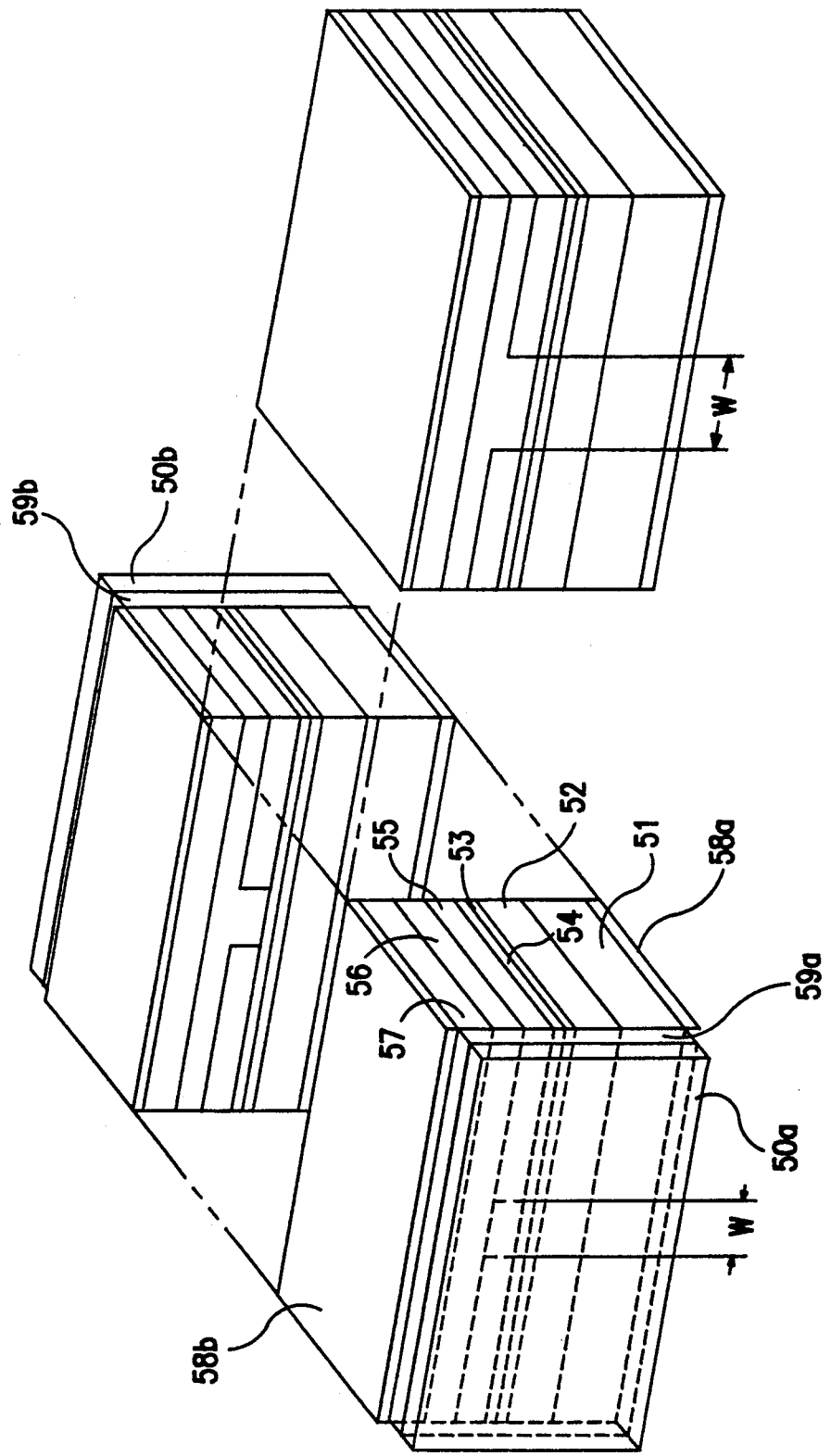
FIG. 18 is a partially cutaway perspective view of still another semiconductor laser device of this invention.

FIG. 18 shows still another semiconductor laser device of this invention, which can be preferably used in an optical pickup apparatus. This semiconductor laser device has a similar structure to that of the semiconductor laser device of FIG. 17 and is produced as follows.

First, on an n-GaAs substrate 51, an n-Al$_{0.5}$Ga$_{0.5}$As cladding layer 52, undoped Al$_{0.15}$Ga$_{0.85}$As active layer 53, and a p-Al$_{0.5}$Ga$_{0.5}$As cladding layer 54 are successively grown by molecular beam epitaxy. On the cladding layer 54, an n-GaAs current confining layer 55 is formed. The center portion of the current confining layer 55 in the width direction is removed in a striped form by etching to form a current path and a waveguide. Thereafter, on the p-Al$_{0.5}$Ga$_{0.5}$As cladding layer 54 and the n-GaAs current confining layer 55, a p-Al$_{0.5}$Ga$_{0.5}$As layer 56 is grown so as to bury the current path and the waveguide. On the p-Al$_{0.5}$Ga$_{0.5}$As layer 56, a p-GaAs contact layer 57 is formed.

On the back face of the n-GaAs substrate 51, an n-sided electrode 58a is formed, while on the upper face of the p-GaAs contact layer 57, a p-sided electrode 58b is formed.

Also in this example, the current confining layer 55 functions as a light-absorbing layer, and the waveguide width of the loss-guide type is defined by the width of the current path in the current confining layer 55. The waveguide width is smaller in the cavity portions near the end facets than in the center portion other than the cavity portions near the end facets. For example, the waveguide width w in the cavity portions within a distance of 25,000 nm from the cavity end facets is set constant to be 3,000 nm, whereas the waveguide width W in the center portion other than the cavity portions near the end facets is set to be 5,500 nm.

Finally, on the light-emitting facet, an undoped Al$_{0.6}$Ga$_{0.4}$As window layer 59a is formed by gas-source molecular beam epitaxy to have a thickness of 50 nm, and on the window layer 59a, an Al$_2$O$_3$ dielectric film 50a (reflectivity 20%) is formed. On the other end facet, a similar window layer 59b is formed, and on the window layer 59b, a multi-layered film 50b composed of Al$_2$O$_3$ dielectric films and silicon films is formed to have a reflectivity of 60 to 95%.

The semiconductor laser device of this example attained the maximum optical output power level of 400 mW. The horizontal far-field pattern $\theta_h$ was 13° and the vertical far-field pattern $\theta_v$ was 24°, resulting in an ellipticity of 1.8. Therefore, the semiconductor laser device of this example can also be preferably used in an optical pickup apparatus. Moreover, the semiconductor laser device of this example attained stable laser oscillation for 8,000 hours under the conditions, 50° C. and 100 mW, and exhibited extremely high reliability.

EXAMPLE 6

Figure 19:
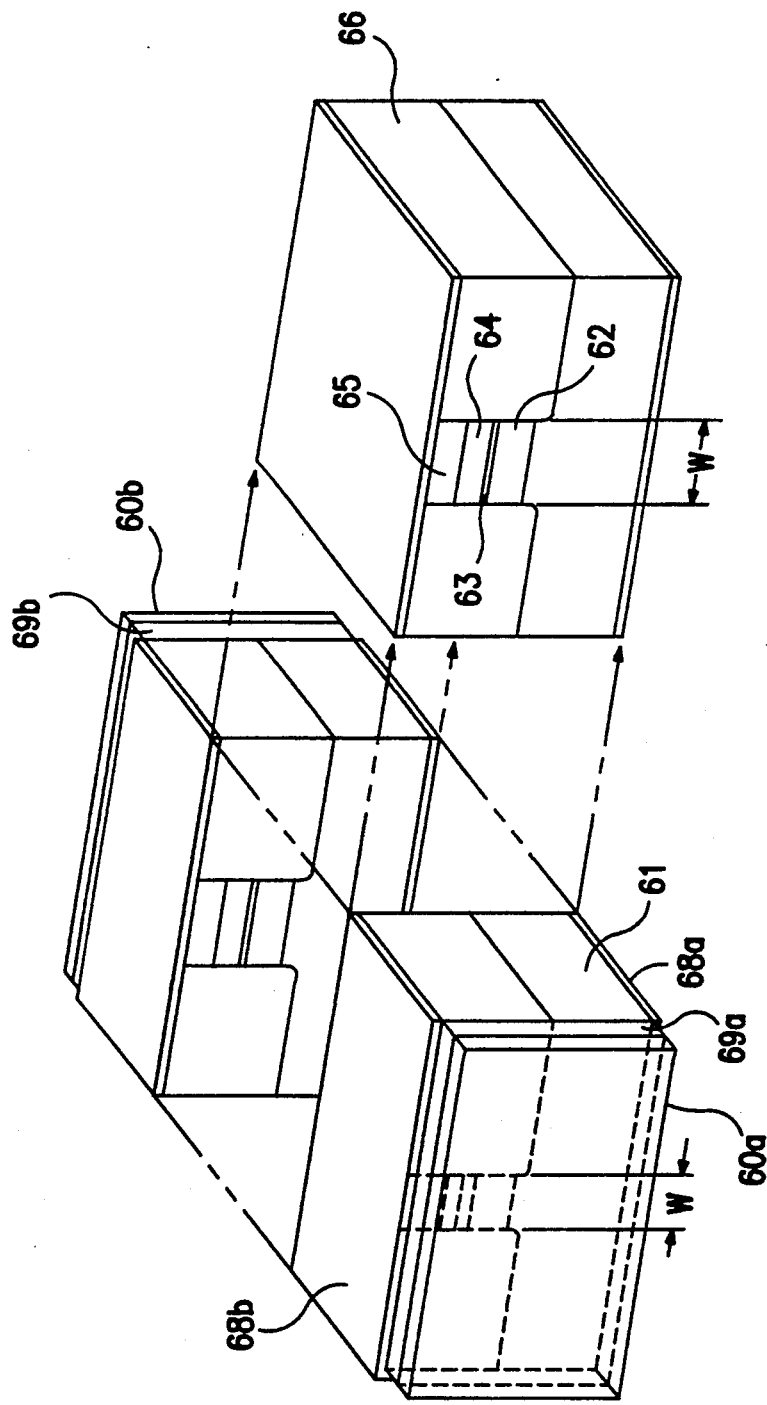
FIG. 19 is a partially cutaway perspective view of still another semiconductor laser device of this invention.

FIG. 19 shows still another semiconductor laser device of this invention, which can be preferably used in an optical pickup apparatus. This semiconductor laser device is produced as follows.

First, on an n-GaAs substrate 61, an n-Al$_{0.5}$Ga$_{0.5}$As cladding layer 62, undoped Al$_{0.15}$Ga$_{0.85}$As active layer 63, a p-Al$_{0.5}$Ga$_{0.5}$As cladding layer 64, and a p-GaAs contact layer 65 are successively grown by molecular beam epitaxy. The side portions reaching the substrate 61 in the width direction of the cladding layer 62, active layer 63, cladding layer 64, and contact layer 65 are removed by etching to retain the center portion in the width direction as an oscillation region. On both sides of the center portion, a highly-resistive $Al_{0.55}Ga_{0.45}As$ layer 66 is formed.

The waveguide width defined by the width of the active layer 63 is smaller in the cavity portions near the end facets than in the center portion other than the cavity portions near the end facets, and increases gradually with an increase in the distance from the end facets. In this example, for example, the waveguide width w in the cavity portions near the end facets is set to be 2,000 nm, whereas the waveguide width W in the center portion other than the cavity portions near the end facets is set to be 4,000 nm.

On the back face of the n-GaAs substrate 61, an n-sided electrode 68a is formed, while on the upper face of the p-GaAs contact layer 65 and the high-resistive $Al_{0.55}Ga_{0.45}As$ layer 66, a p-sided electrode 68b is formed.

Finally, on the light-emitting facet, an undoped $Al_{0.55}Ga_{0.45}As$ window layer 69a is formed by atomic layer epitaxy to have a thickness of 10 nm, and on the window layer 69a, an $MgF_2$ dielectric film 60a (reflectivity 10%) is formed. On the other end facet, a similar window layer 69b is formed, and on the window layer 69b, a multi-layered film 60b composed of $MgF_2$ dielectric films and silicon films is formed to have a reflectivity of 60 to 95%.

The semiconductor laser device of this example attained the maximum optical output power level of 400 mW. The horizontal far-field pattern $\theta_h$ was 15° and the vertical far-field pattern $\theta_v$ was 24°, resulting in an ellipticity of 1.6. Therefore, the semiconductor laser device of this example can also be preferably used in an optical pickup apparatus. Moreover, the semiconductor laser device of this example attained stable laser oscillation for 8,000 hours under the conditions, 50° C. and 100 mW, and exhibited extremely high reliability.

EXAMPLE 7

The semiconductor laser device of this invention can also have an effective index-guiding structure. For example, the semiconductor laser device of Example 4 shown in FIG. 17 may be modified to have a buried structure in which the n-$Al_{0.5}Ga_{0.5}As$ cladding layer 42, the undoped $Al_{0.15}Ga_{0.85}As$ active layer 43, and the p-$Al_{0.5}Ga_{0.5}As$ cladding layer 44 are successively grown on the n-GaAs substrate 41, after which the side portions of the p-$Al_{0.5}Ga_{0.5}As$ cladding layer 44 in the width direction are partially etched to retain the center portion in the width direction as an oscillation region 44a, and the oscillation region 44a is then buried with a current confining layer 45 made of undoped $Al_{0.6}Ga_{0.4}As$, ZnS, ZnSe, or other semiconductor materials having a greater band gap and a smaller refractive index than those of the p-$Al_{0.5}Ga_{0.5}As$ cladding layer 44. With the use of such a construction, an effective index-guiding structure can be achieved, in which the waveguide width is defined by the width of the current confining layer. In this case, an O-doped $Al_{0.55}Ga_{0.45}As$ layer is formed as the window layer 48a to be provided on the light-emitting facet, and on the window layer 48a, an AlN transparent film 49a (reflectivity 12%) is provided.

In this example, the waveguide width w at the end facets is set to be 2,500 nm, whereas the waveguide width W in the center portion other than the cavity portions near the end facets is set to be 4,000 nm.

The semiconductor laser device of this example attained the maximum optical output power level of 400 mW. The horizontal far-field pattern $\theta_h$ was 13.8° and the vertical far-field pattern $\theta_v$ was 23.5°, resulting in an ellipticity of 1.7. Therefore, the semiconductor laser device of this example can also be preferably used in an optical pickup apparatus. Moreover, the semiconductor laser device of this example attained stable laser oscillation for 8,000 hours under the conditions, 50° C. and 100 mW, and exhibited extremely high reliability.

EXAMPLE 8

Figure 20:
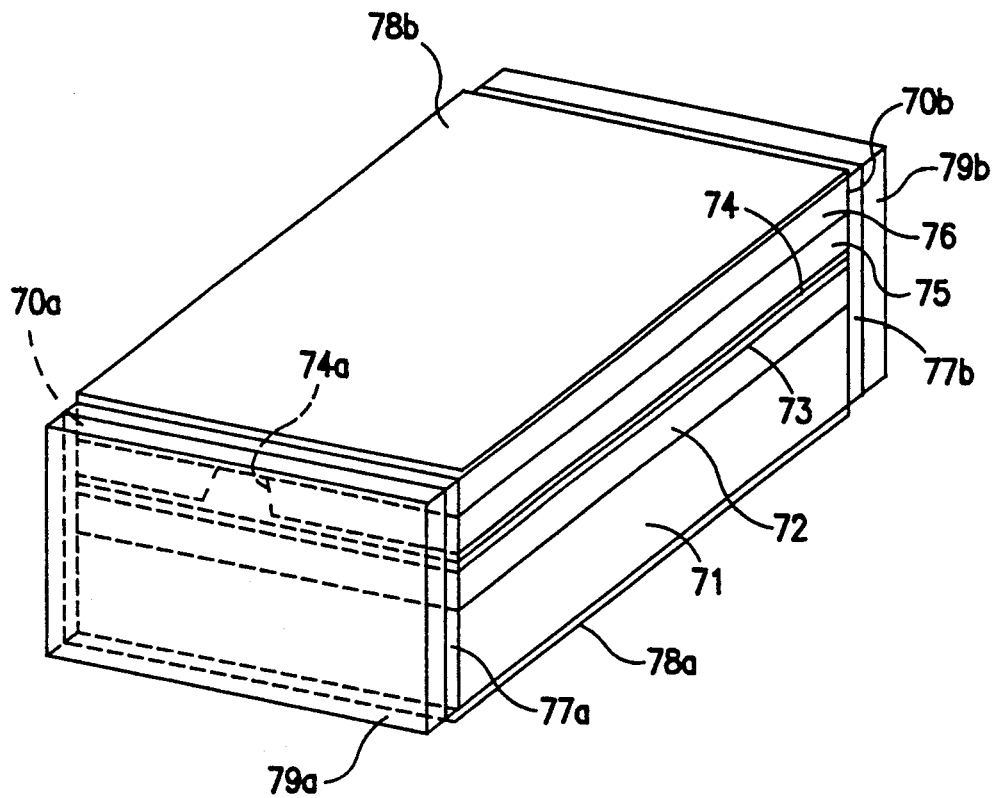
FIG. 20 is a perspective view of still another semiconductor laser device of this invention.

This invention is also applicable to semiconductor laser devices which are prepared from InGaAlP-type semiconductor materials and emit red laser light with a wavelength of 600 nm. FIG. 20 shows one example of such semiconductor laser devices. This semiconductor laser device is an inner-striped laser having a selectively buried ridge (SBR) waveguide structure (see, e.g., Hatakoshi et al., Laser Research, vol. 17 (1990), p. 706) and produced as follows.

First, on an n-GaAs substrate 71, an n-$In_{0.5}(Ga_{0.3}Al_{0.7})_{0.5}P$ cladding layer 72, an undoped $In_{0.5}Ga_{0.5}P$ active layer 73, and a p-$In_{0.5}(Ga_{0.3}Al_{0.7})_{0.5}P$ cladding layer 74 are successively grown by metal organic chemical vapor deposition. On the surface of the cladding layer 74, a striped $SiO_2$ film is formed. Using the striped $SiO_2$ film as a mask, a normal mesa-striped ridge 74a is formed by chemical etching. Then, on the side face of the mesa-striped ridge 74a other than the striped $SiO_2$ film and on the surface of the cladding layer 74, an n-GaAs current confining layer 75 is selectively grown by metal organic chemical vapor deposition. The striped $SiO_2$ film is removed, and a p-GaAs contact layer 76 is grown over the entire surface by metal organic chemical vapor deposition. Then, a pair of cavity end facets 70a and 70b are formed by cleavage, and an n-sided electrode 78a is formed on the GaAs substrate 71, while a p-sided electrode 78b is formed on the p-GaAs contact layer 76.

Finally, on the end facets 70a and 70b, highly-resistive $In_{0.5}(Ga_{0.1}Al_{0.9})_{0.5}P$ window layers 77a and 77b each having a carrier concentration of $10^{17}$ cm$^{-3}$ or less are grown to have a thickness of 500 nm, respectively. On the window layer 77a formed on the end facet 70a functioning as a light-emitting facet, an $Al_2O_3$ dielectric film 79a (reflectivity 12%) is provided, while on the window layer 77b formed on the other end facet, a multi-layered film 79b (reflectivity 95%) composed of $Al_2O_3$ dielectric films and silicon films is provided.

The semiconductor laser device produced in this way was mounted on a heat sink and operated. A maximum optical output power of 150 mW was obtained and the optical output power was thermally saturated. The semiconductor laser device of this example attained high reliability and there was no deterioration of the end facets even when the device was operated at an optical output power level of 100 mW for a long period of time. In growing the window layers on the end facets 70a and 70b, oxygen adhering to the surface of the end facets is removed, so that satisfactory interfaces are formed between the end facets and the window layers, thereby preventing the deterioration of the end facets. Moreover, emitted laser light is not absorbed by the window layers, so that there is no increase in the temperature of the end facets and the deterioration of the end facets can be completely prevented, thereby obtaining extremely high reliability.

Figure 21:
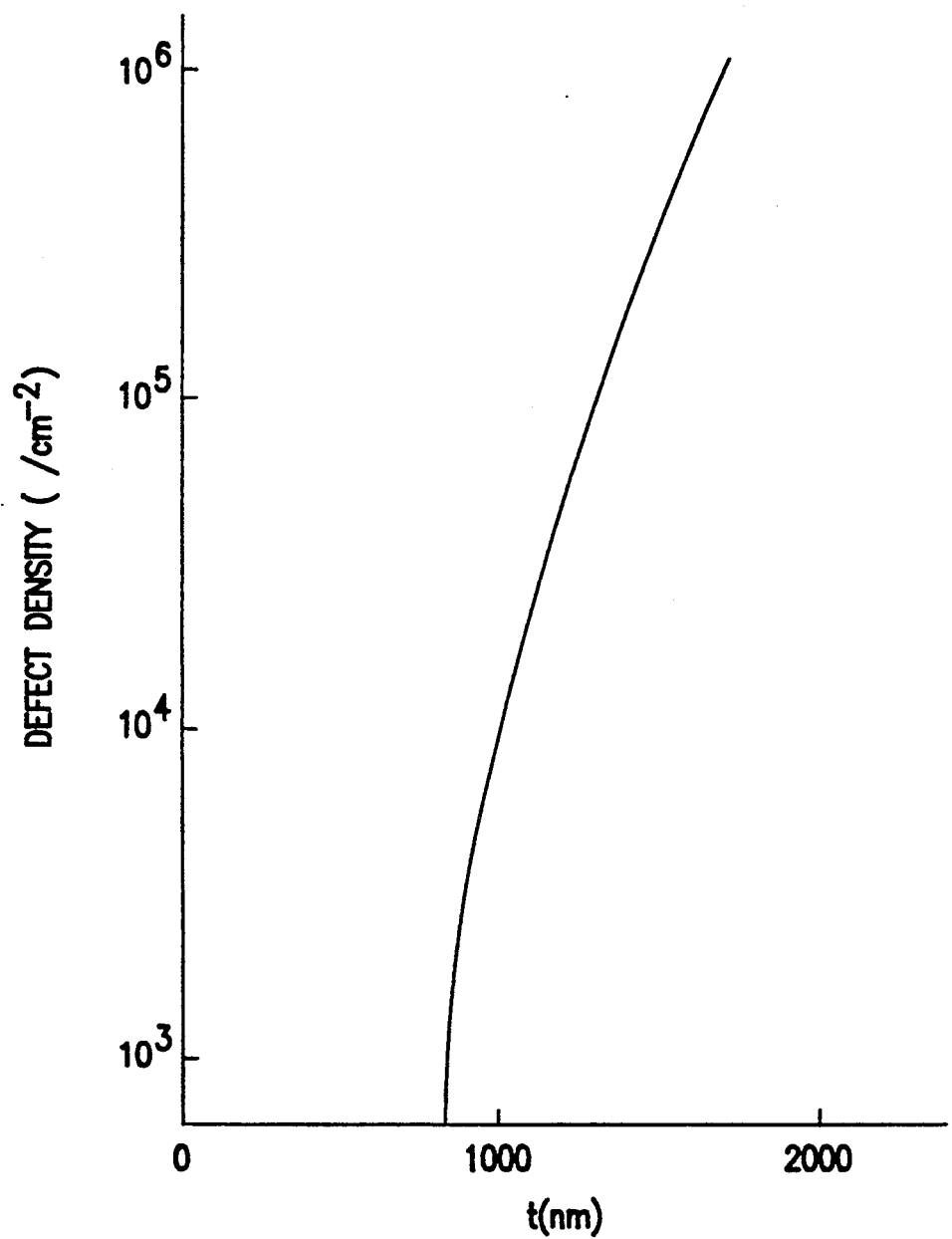
FIG. 21 is a graph showing the relationship between the thickness and the crystal defect density of the window layer of the semiconductor laser device of FIG. 20.
Figure 22:
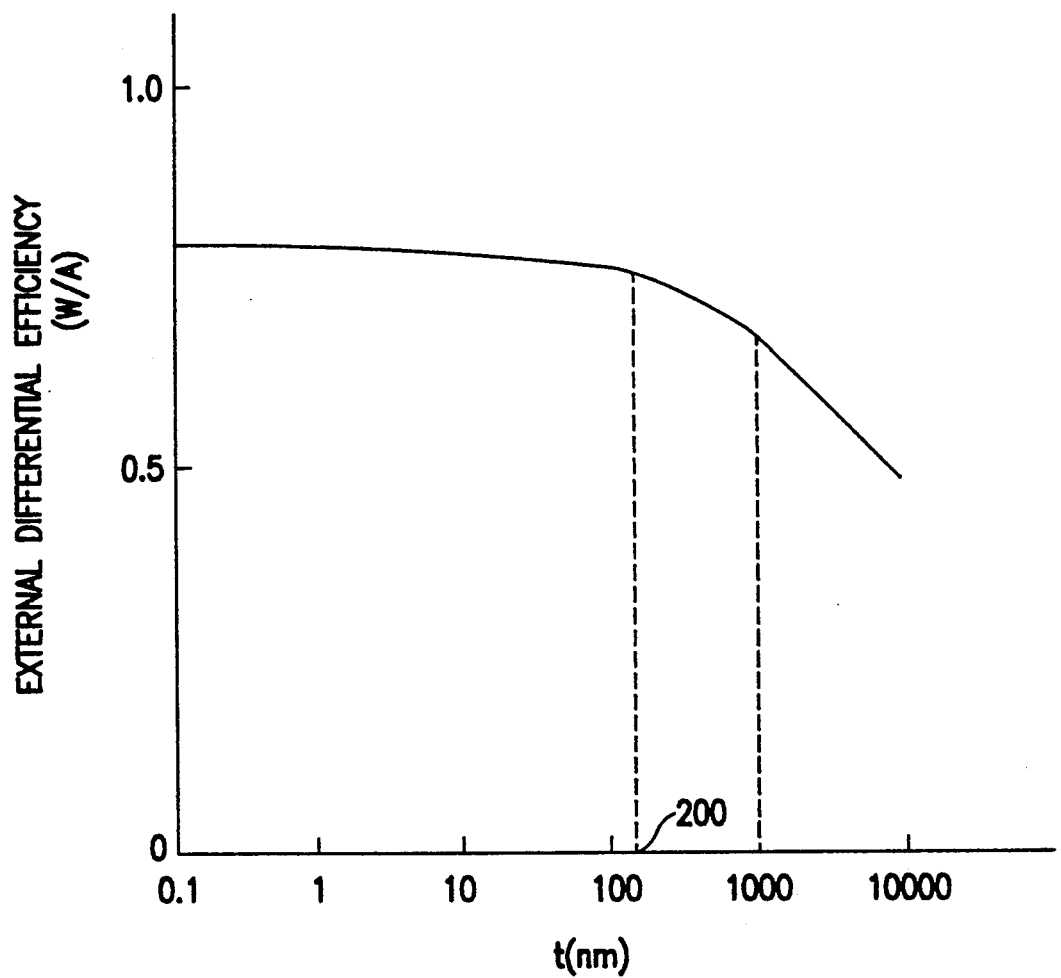
FIG. 22 is a graph showing the relationship between the thickness of the window layer and the external differential efficiency of the semiconductor laser device of FIG. 20.
Figure 23:
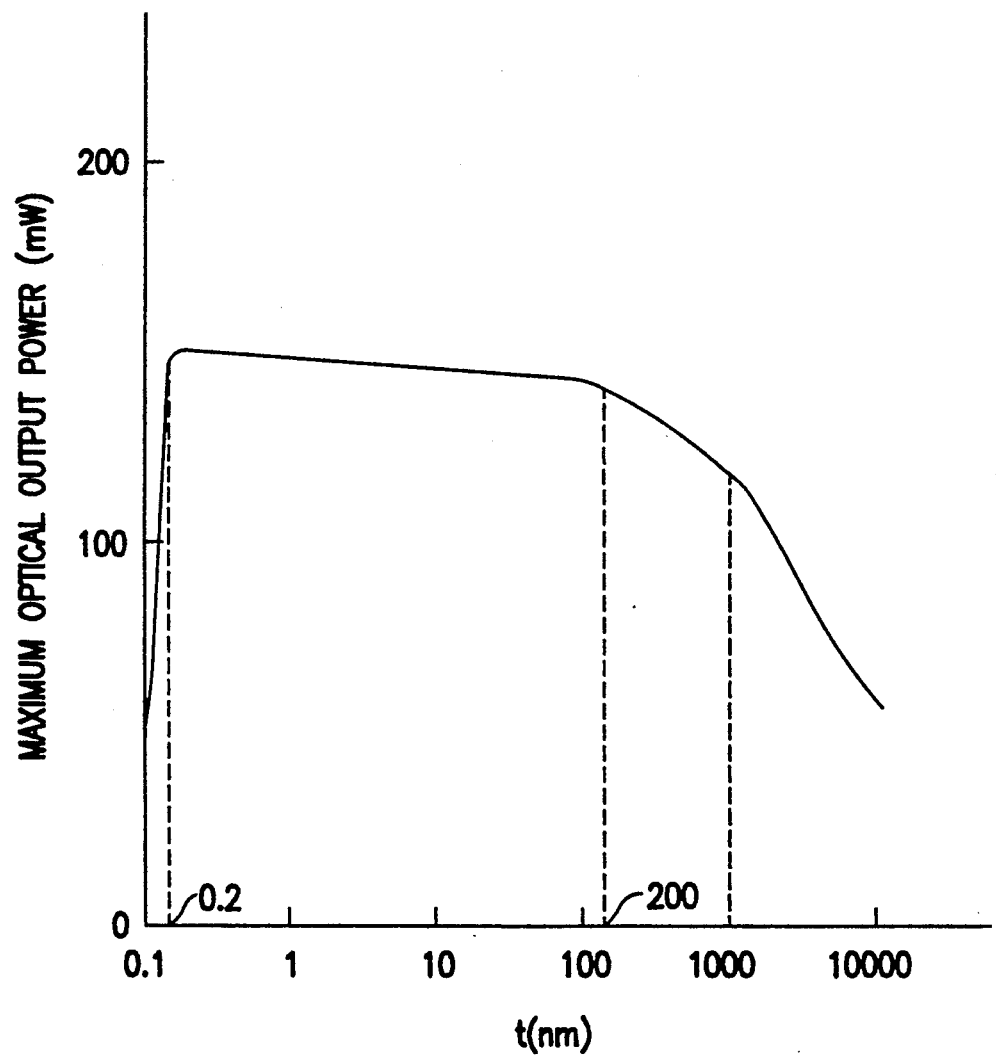
FIG. 23 is a graph showing the relationship between the thickness of the window layer and the maximum optical output power of the semiconductor laser device of FIG. 20.
Figure 24:
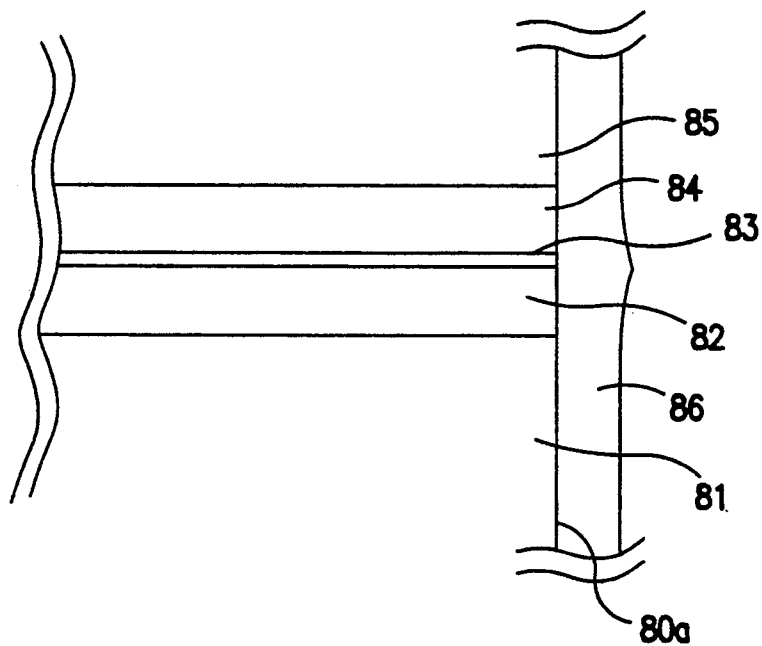
FIG. 24 is a fragmentary sectional view of the front facet portion of a conventional semiconductor laser device.

FIGS. 21 to 23 are graphs showing various characteristics of the semiconductor laser device of this example. The window layers 77a and 77b receive some strain from the GaAs substrate 71 having a large lattice mismatching (difference in the lattice constant) at the end facets 70a and 70b. The rate of generation of crystal defects to strain depends upon the thickness of the window layers. As shown in FIG. 21, when the thickness is 1,000 nm or more, the crystal defect density is $10^4$ cm$^{-2}$ or more. In contrast, when the thickness is 1,000 nm or less, the crystal defect density is decreased.

Moreover, as shown in FIG. 22, when the thickness of the window layers is 1,000 nm or more, the external differential efficiency is significantly decreased. This may be because the window layers formed in the vicinity of the substrate 71 receive some strain to form crystal defects, whereby laser light is scattered and optical loss is increased. In contrast, when the thickness is 1,000 nm or less, the strain in the window layers is reduced and few crystal defects are generated, thereby obtaining satisfactory efficiency. In particular, when the thickness is about 200 nm or less, very few crystal defects are generated, and extremely satisfactory efficiency is obtained.

Furthermore, as shown in FIG. 23, when the thickness of the window layers is 1,000 nm or more, the maximum optical output power is decreased. This is, as described above, because crystal defects are generated in the window layers to form interface states, whereby the degree of non-radiative recombination caused by the interface states is increased. In particular, when the thickness is about 200 nm or less, the maximum optical output power of 150 mW is obtained. In contrast, when the thickness is less than 0.2 nm, it is smaller than the molecular size of InGaAlP crystals in the window layers, so that the window layers do not have the properties of InGaAlP molecules and the cavity end facets exhibit the same characteristics as those obtained when the window layers are not formed thereon.

As described in Example 2, on the window layers 77a and 77b, $(Ga_{0.7}Al_{0.3})_{0.5}P_{0.5}$ protective layers, protective layers made of a sulfur-containing film, or multi-layered protective layers composed of these layers in this order may be formed, respectively. In any case, the semiconductor laser device of this example can attain high reliability for a long period of time.

EXAMPLE 9

Even if the window layers 17a and 17b made of InGaAlP-type semiconductor materials are formed on the cavity end facets 10a and 10b of an AlGaAs-type semiconductor laser device as shown in FIG. 1, the same excellent advantages can be attained. In this case, as described in Example 2, protective layers may be formed on the window layers 17a and 17b, respectively. The thicknesses of the window layers are set so as to generate crystal defects by strain. As can be seen from the graph in FIG. 21, when an InGaAlP layer is formed on a GaAs layer, a thickness of 1,000 nm or more results in a high crystal defect density of $10^4$ cm$^{-2}$, whereas a thickness of 1,000 nm or less prevents the generation of crystal defects. The semiconductor laser device of this example, having the window layers 17a and 17b made of InGaAlP, attained the same excellent advantages as those obtained by the semiconductor laser devices of Examples 2 and 3, when the thickness of the window layers 17a and 17b was set to be 200 nm.

EXAMPLE 10

Even if the window layers 77a and 77b made of AlGaAs-type semiconductor materials are formed on the cavity end facets 10a and 10b of an InGaAlP-type semiconductor laser device as shown in FIG. 20, the same excellent advantages can be attained. In this case, as described in Example 2, protective layers may be formed on the window layers 77a and 77b, respectively. The thicknesses of the window layers are set so as to generate crystal defects by strain. As can be seen from the graph in FIG. 21, when an InGaAlP layer is formed on a GaAs layer, a thickness of 1,000 nm or more results in a high crystal defect density of $10^4$ cm$^{-2}$, whereas a thickness of 1,000 nm or less reduces the amount of crystal defects. The InGaAlP-type semiconductor laser device of this example, having the window layers 77a and 77b made of $Al_{0.6}Ga_{0.4}As$, attained the same excellent advantages as those obtained by the semiconductor laser device of Example 8, when the thickness of the window layers 77a and 77b was set to be 200 nm.

Although in the above-mentioned examples the window layers are formed on both cavity end facets, a window layer may be formed only on the light-emitting facet. The above-mentioned examples described only the undoped window layer having a carrier concentration of $10^{17}$ cm$^{-3}$ or less, however, the window layers may be made of n-type or p-type semiconductor materials having a carrier concentration of $10^{17}$ cm$^{-3}$ or more, so long as the device characteristics are not adversely affected by leakage current flowing through the window layers. The reflectivity at the end facets is not limited to the particular values described in the above-mentioned examples.

Moreover, although the above-mentioned examples described the cases where the active layer is a single semiconductor layer, the same excellent advantages can be attained, even if a multi-quantum well structure having a multi-layered superlattice active layer is employed. As a waveguide structure, a three-layered structure composed of a first cladding layer, an active layer, and a second cladding layer is employed in the above-mentioned examples, however, this invention is applicable to a large optical cavity (LOC) structure in which an optical guiding layer is formed on one side of the active layer; a separated confinement heterostructure (SCH) in which an optical guiding layer is formed on both sides of the active layer; and a graded-index separated confinement heterostructure (GRIN-SCH) in which an optical guiding layer has a gradually varying refractive index. The above-mentioned examples described the cases where the waveguide has a single striped structure, however, this invention is also applicable to a multi-striped structure in which a waveguide has an array form.

Furthermore, as a method for forming a pair of cavity end facets, dry etching, chemical etching, or the like can also be used, in place of cleavage. As a method for growing a window layer on the cavity end facets, vapor phase epitaxy can be used, such as metal organic chemical vapor deposition, molecular beam epitaxy, atomic layer epitaxy, or metal organic molecular beam epitaxy.

EXAMPLE 11

Figure 25:
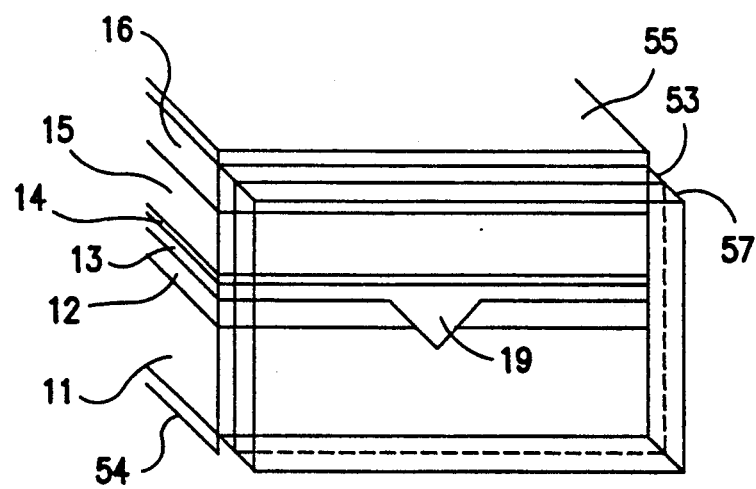
FIG. 25 is a perspective view showing the front facet face of a semiconductor laser device produced by a method of this invention.
Figure 30A:
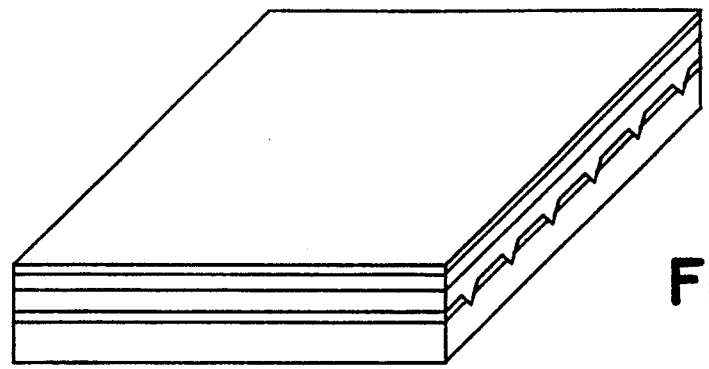
FIGS. 30A to 30H are perspective views showing the conventional process for producing a semiconductor laser device.
Figure 30B:
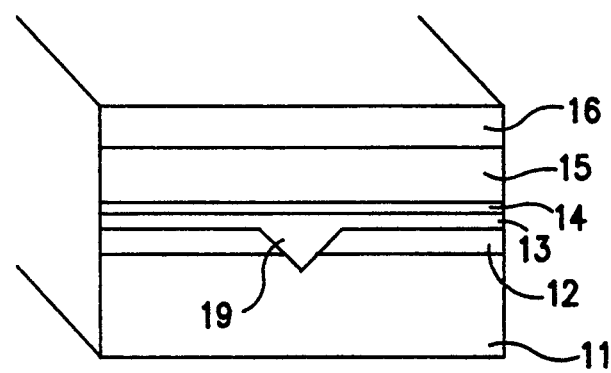
Figure 30C:
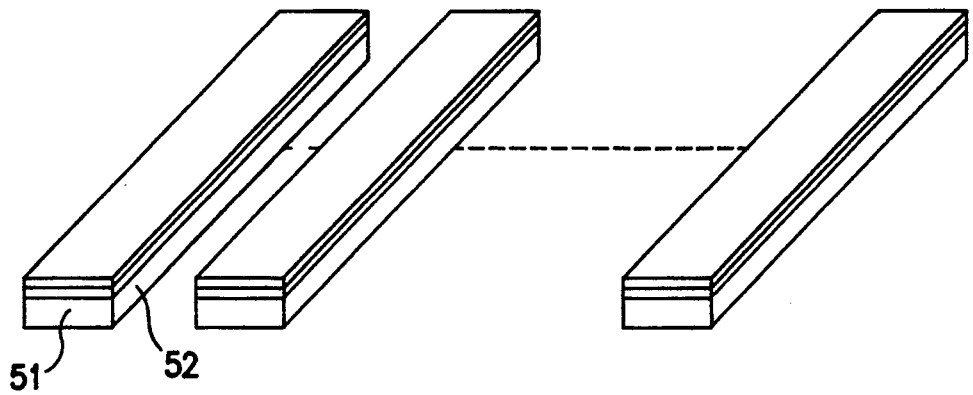
Figure 30D:
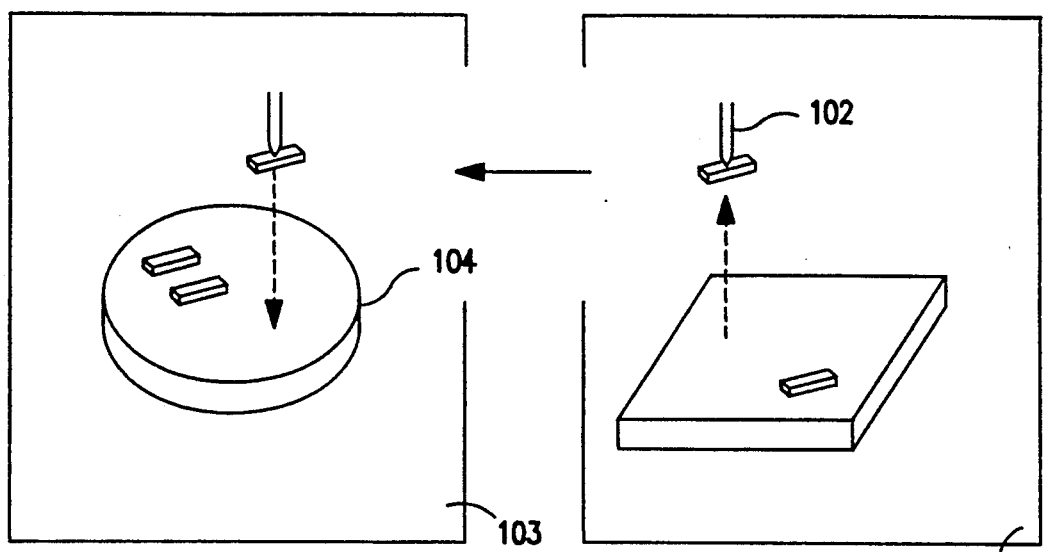
Figure 30E:
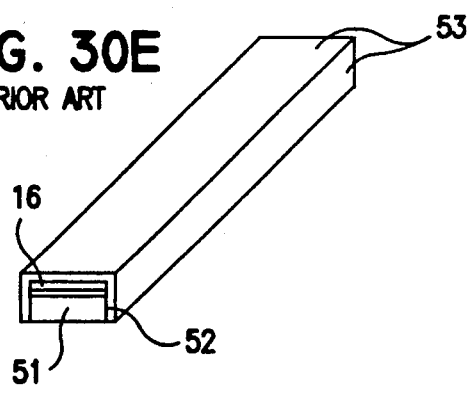
Figure 30F:
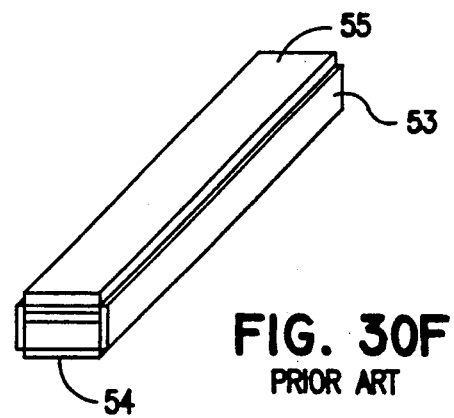
Figure 30G:
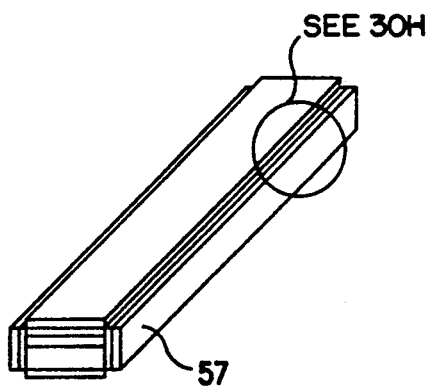
Figure 30H:
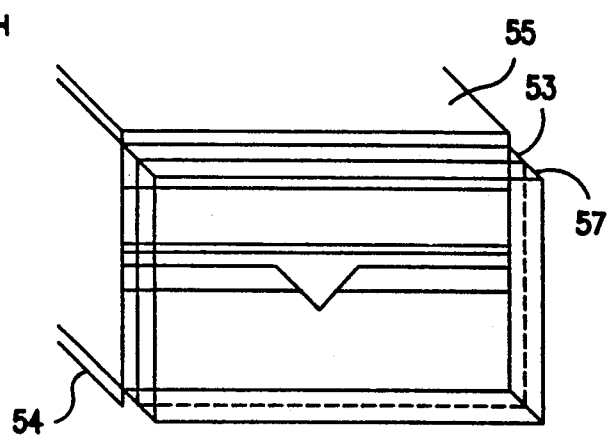

FIG. 25 shows a semiconductor laser device produced by a method of this invention. This figure shows a structure conceptually the same as that of FIGS. 30B and 30H, and the detailed description thereof is omitted, except that a Ga$_{0.5}$Ga$_{0.5}$As layer 53 having a greater band gap than that of the active layer 14 has a thickness of about 0.2 μm. In the case where the large-band-gap layer 53 is formed only on the cavity end facet on the light-emitting side, an end-facet reflective film 57 having a lower reflectivity is formed on the surface of the large-band-gap layer 53, whereas an end-facet reflective film 58 having a higher reflectivity (not shown in FIG. 25) is formed on the other cavity end facet.

Figure 26A:
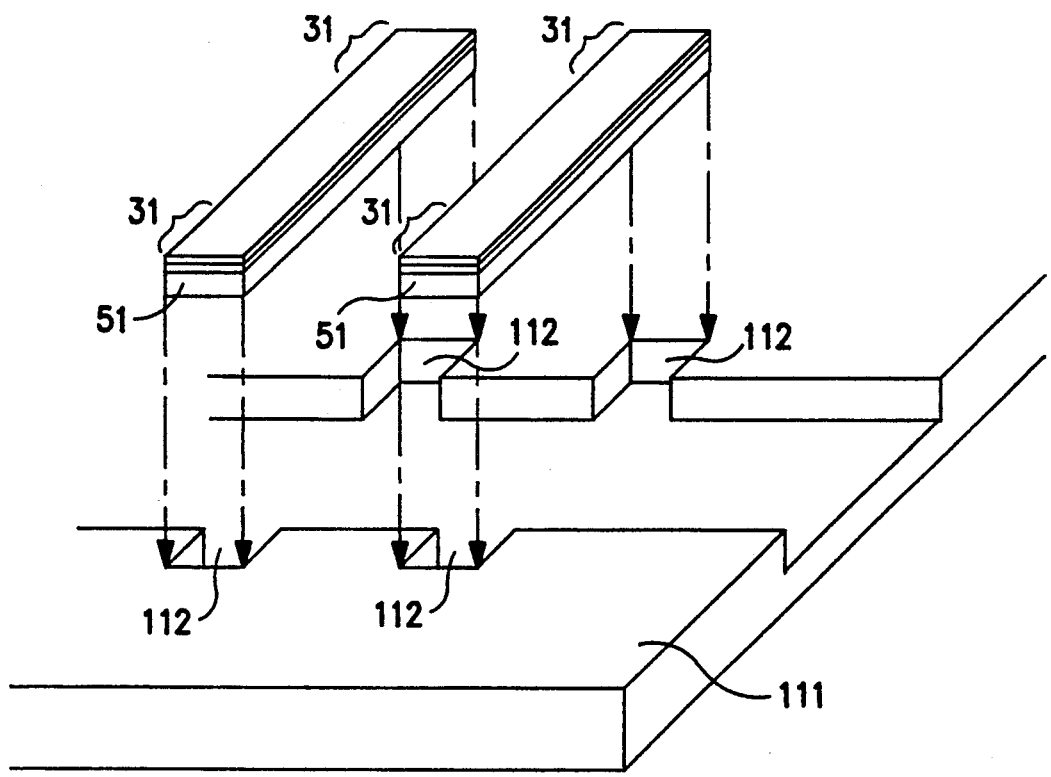
FIGS. 26A to 26C are perspective views showing a production method of the semiconductor laser device of FIG. 25.
Figure 26B:
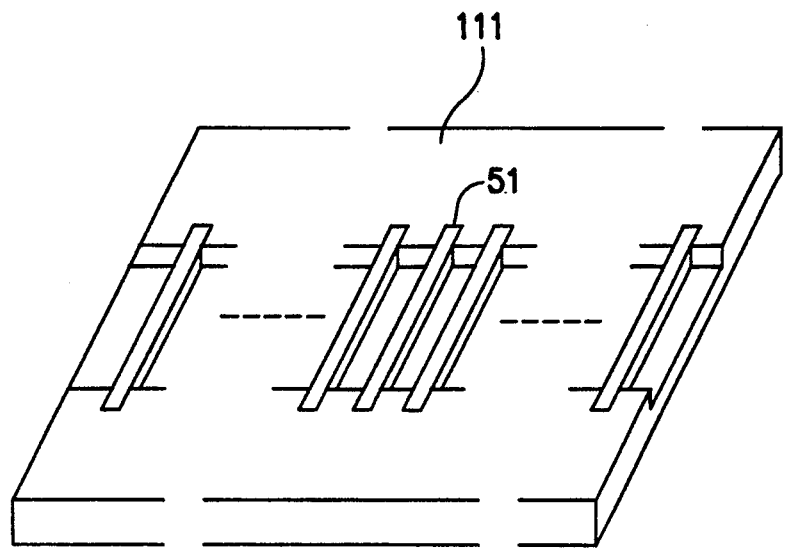
Figure 26C:
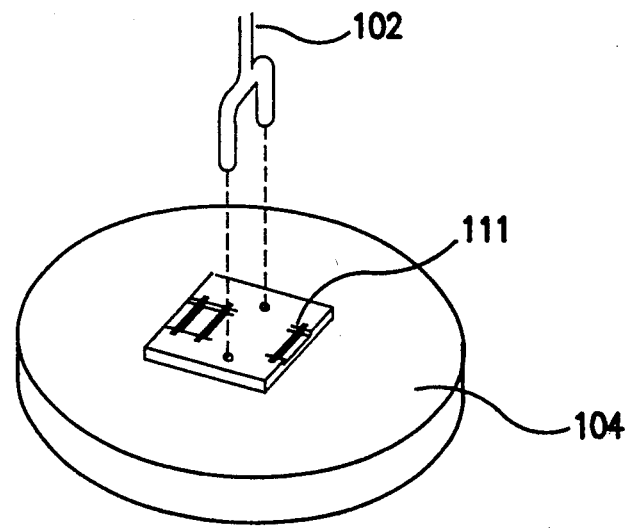

A semiconductor laser device having such a structure is produced as follows. First, laser bars 51 are formed by cleavage in the same way as the conventional process shown in FIG. 30C. Then, as shown in FIG. 26A, the laser bars 51 are fixed in a supporting jig 111 made of carbon. In FIG. 26A, only a groove pattern for fixing the laser bars 51 therein, which is provided in the supporting jig 111 made of carbon, is illustrated. The supporting jig 111 shown in this figure has a number of concave portions 112 to fit the end portions 31 of the laser bars 51. The laser bars 51 are fixed in the supporting jig 111 with the top face of the multi-layered structure including the GaAlAs active layer 14 being directed upward. FIG. 26B shows a number of the laser bars 51 fixed in the supporting jig 111, which are arranged with an appropriate distance therebetween (the distances may or may not be equal to each other). The supporting jig 111 in which a number of the laser bars 51 are fixed in this way is introduced into the growth preparatory chamber of an MOCVD apparatus. Then, the supporting jig 111 with the laser bars 51 is carried by the use of a vacuum suction-type pincette 102 and placed on the susceptor 104 of a growth chamber, as shown in FIG. 26C. On the cleavage planes of the laser bars 51, a GaAlAs semiconductor layer having a greater band gap than that of the active layer 14 is grown, during which the positions of the supporting jig 111 and laser bars 51 are not changed by a turbulent gas flow. After the growth, the supporting jig 111 with the laser bars 51 is taken out of the growth chamber and carried back into the preparatory chamber. Not only the formation of electrodes 54 and 55 on the laser bars 51 but also the formation of end-facet protective film 57 on the large-band-gap semiconductor layer 53 are the same as those of the conventional process.

According to the method of this example, the laser bars 51 are fixed in the supporting jig 111, so that the positions of the respective laser bars 51 are stabilized against the gas flow during the MOCVD growth. Therefore, the variation in the thickness of the large-band-gap semiconductor layer 53 became extremely small not only within one of the laser bars but also between the laser bars. For example, when the thickness of the large-band-gap semiconductor layer 53 was set to be 0.2 μm, the variation in the thickness was 0.195 to 0.205 μm.

The semiconductor laser devices produced by the method of this example did not exhibit the deterioration of characteristics such as far-field pattern even when operated at a high optical output power level for a long period of time, and attained extremely high reliability for 8,000 hours or more when operated under the conditions, 50° C. and 150 mW. Moreover, according to the method of this example, such semiconductor laser devices were obtained at a high yield of 90% or more.

EXAMPLE 12

FIGS. 27A and 27B show the production of a semiconductor laser device by another method of this invention. The structure of the laser bar before the growth of a semiconductor layer on the cleavage planes. is the same as that of Example 11 (FIG. 25).

In this example, the laser bars are fixed in a supporting jig 121 made of PBN with the cleavage planes 52 corresponding to the light-emitting facets being directed upward. Then, a fixing jig 122 made of PBN is placed on the supporting jig 121, as shown in FIG. 27A, whereby the laser bars are further fixed securely so that the laser bars do not jump out of the grooves of the supporting jig 121. The laser bars fixed by the supporting jig 121 and the fixing jig 122 are shown in FIG. 27B. The fixing jig 122 is attached to the supporting jig 121 by means of screws 123 made of PBN.

Figure 28A:
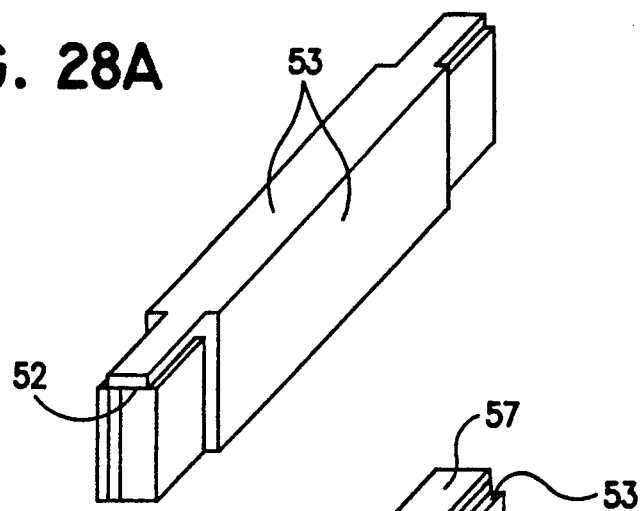
FIGS. 28A and 28B are perspective views showing the shape of a laser bar in the production of FIGS. 27A and 27B.
Figure 28B:
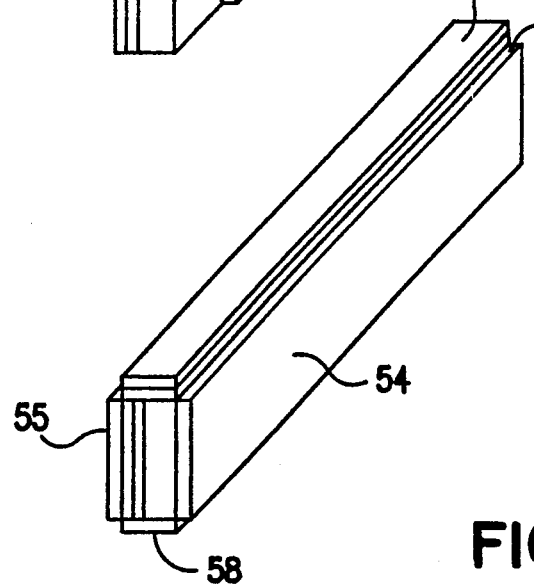

The laser bars fixed in such a manner are carried into an MOCVD apparatus, and the growth of a semiconductor layer having a greater band gap than that of the active layer is conducted in the same way as described in Example 11. The large-band-gap semiconductor layer is grown to have a thickness of 0.05 μm. The laser bars after the growth are shown in FIG. 28A. On the top face of the multi-layered structure including the active layer and on the back face of the substrate, as well as on the cleavage plane 52 corresponding to the light-emitting facet, the large-band-gap semiconductor layer 53 has been grown, and the unnecessary portions of the large-band-gap semiconductor layer 53 are removed by etching, followed by deposition of electrodes 54 and 55, as shown in FIG. 28B. Then, the light-emitting facet is coated with a lower-reflective film, whereas the other end facet is coated with a higher-reflective film, as shown in FIG. 28B. Finally, the laser bars are separated into chips by cleavage, and the respective chips are mounted on a heat sink, resulting in a plurality of high-power semiconductor laser devices. The thickness of the large-band-gap semiconductor layer 53 was varied in the range of 0.049 to 0.051 μm, although the thickness was set to be 0.05 μm.

As described above, Examples 11 and 12 were concerned with the case where in the process of growing a semiconductor layer having a greater band gap than that of the active layer on at least one of the cleavage planes of the laser bars which is corresponding to the light-emitting facet by vapor phase epitaxy, the laser bars are fixed in a supporting jig made of carbon or PBN. In some cases, fixing jig and screws made of carbon or PBN may be used together with the supporting jig. The material for these jigs is not limited to carbon and PBN, as quartz can also be used. These jigs can also have a structure which is constituted by any one of these materials and further coated with glassy carbon or SiC. These jigs can also be a crystal of GaAs, Si or InP which is provided with desired grooves. Moreover, the shapes of the jigs is not limited to those of Examples 11 and 12, and any shape can be used, so long as the laser bars are securely fixed therein.

In Examples 11 and 12, VSIS semiconductor laser devices as shown in FIG. 25, which further include a Ga$_{0.5}$Al$_{0.5}$As semiconductor layer having a greater band gap than that of the active layer and having a thickness of 0.2 μm (Example 11) or 0.05 μm (Example 12), were described. When the thickness was in the range of 0.2 nm to 3 μm, strain in the Ga$_{0.5}$Al$_{0.5}$As semiconductor layer was reduced and there was no generation of crystal defects, whereby satisfactory device characteristics were obtained (the thickness of less than 0.2 nm was not achieved because it is smaller than that of a mono-atomic layer). Moreover, semiconductor laser devices which can be produced by the method of this invention are not limited to the VSIS structure, and may also be of the loss-guide structure or buried structure, as shown in FIGS. 29A to 29D.

First, the structure of FIG. 29A will hereinafter be described in detail. This structure includes an n-Ga$_{0.5}$Al$_{0.5}$As cladding layer 23 (having a thickness of 1 μm), an undoped Ga$_{0.88}$Al$_{0.12}$As active layer 24 (having a thickness of 0.06 μm), a p-Ga$_{0.5}$Al$_{0.5}$As first cladding layer 25 (having a thickness of 0.25 μm), an n-GaAs current confining layer 22 (having a thickness of 0.4 μm), a p-Ga$_{0.5}$Al$_{0.5}$As second cladding layer 25' (having a thickness of 1 μm outside the striped groove 29), and a p-GaAs cap layer 26 (having a thickness of 1 μm), all of which are successively formed on an n-GaAs substrate 21 in this order. Part of the n-GaAs current confining layer 22 is removed to form the striped groove 29 which functions as a current path. Within the portion of the active layer 24 which is positioned just below the striped groove 29, laser oscillation will occur. The remaining portion of the n-GaAs current confining layer 22 functions to absorb laser light exuding from the active layer 24, thereby forming a loss-guide structure. In many cases, the growth by molecular beam epitaxy or metal organic chemical vapor deposition is conducted twice to form such a structure.

Figure 29A:
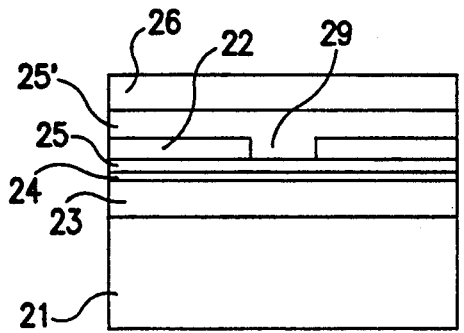
FIGS. 29A to 29D are sectional views of another semiconductor laser device produced by a method of this invention.
Figure 29B:
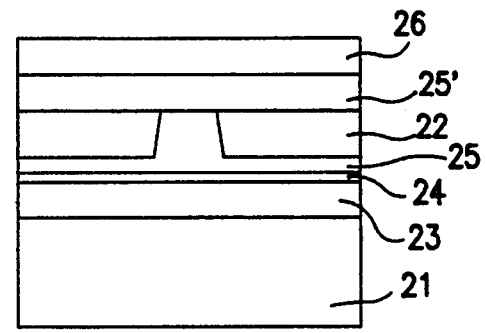

The structure of FIG. 29B is similar to that of FIG. 29A; however, after the formation of the p-Ga$_{0.5}$Al$_{0.5}$As first cladding layer 25, the portions of the first cladding layer 25 on both sides of the oscillation region are removed to a desired thickness by etching, and the n-GaAs current confining layer 22 is then formed on both sides of the oscillation region.

Figure 29C:
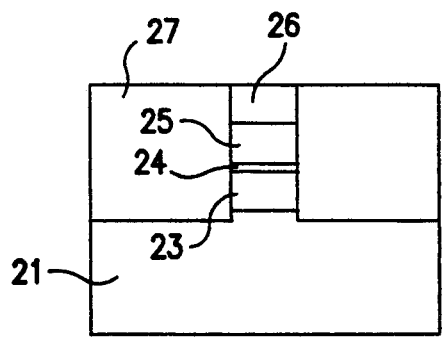

FIG. 29C shows a buried structure in which an n-Ga$_{0.55}$Al$_{0.45}$As cladding layer 23, an undoped Ga$_{0.88}$Al$_{0.12}$As active layer 24, a p-Ga$_{0.55}$Al$_{0.45}$As cladding layer 25, and a p-GaAs cap layer 26 are successively formed on an n-GaAs substrate 21 in this order. On both sides of the oscillation region, a highly-resistive Ga$_{0.5}$Al$_{0.5}$As layer 27 is formed.

Figure 29D:
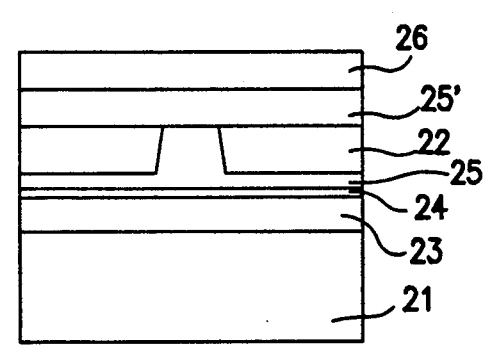

The structure of FIG. 29D is similar to that of FIG. 29B; however, the current confining portion is filled with a lower-reflective Ga$_{0.4}$Al$_{0.6}$As or ZnS layer 22 which does not function to absorb laser light exuding from the active layer 24 but functions to form a waveguide based on a difference in the effective refractive index.

These examples of the semiconductor laser device, which can be produced by the method of this invention, described only the case where on a multilayered structure including a Ga$_{0.88}$Al$_{0.12}$As active layer, a Ga$_{0.5}$Al$_{0.5}$As semiconductor layer having a greater band gap than that of the Ga$_{0.88}$Al$_{0.12}$As active layer is grown. However, the Al mole fractions of the respective semiconductor layers are not limited thereto.

Moreover, the semiconductor laser devices which can be produced by the method of this invention are not limited to the GaAlAs-type, and may be of the InGaAlP-type, InGaAsP-type or any other type. Furthermore, the semiconductor layer to be grown on the cleavage plane can be made of InGaAlP, InGaAsP or any other material, so long as the semiconductor layer has a greater band gap than that of the active layer. For example, similar high output power characteristics were obtained in the structure of FIG. 29B, even if the substrate 21 was made of n-GaAs; the cladding layer 28, the active layer 24, and the cladding layers 25 and 25' were made of n-In$_{0.5}$(Ga$_{0.3}$Al$_{0.7}$)$_{0.5}$P, undoped In$_{0.5}$(Ga$_{0.9}$Al$_{0.1}$)$_{0.5}$P, p-In$_{0.5}$(Ga$_{0.3}$Al$_{0.7}$)$_{0.5}$P, and p-In$_{0.5}$(Ga$_{0.3}$Al$_{0.7}$)$_{0.5}$P, respectively; the cap layer 26 was made of p-GaAs; the current confining layer 22 was made of n-GaAs; and the large-band-gap semiconductor layer to be formed on the cleavage plane was made of In$_{0.5}$(Ga$_{0.2}$Al$_{0.8}$)$_{0.5}$P or Ga$_{0.2}$Al$_{0.8}$As.

The method for growing a large-band-gap semiconductor layer on the cleavage plane is not limited to metal organic chemical vapor deposition (MOCVD); any other vapor phase epitaxy which makes possible the growth of a large-band-gap semiconductor layer on the cleavage plane, such as molecular beam epitaxy (MBE), atomic layer epitaxy (ALE), and metal organic molecular beam epitaxy (MOMBE), can also be used.

As described above, the method for producing a semiconductor laser device according to this invention includes a process for growing a semiconductor layer having a greater band gap than that of the active layer on the light-emitting facet of a semiconductor laser device by vapor phase epitaxy, wherein bar-shaped wafers (i.e., laser bars) having a width corresponding to the cavity length, which have been cut out of a semiconductor laser wafer by cleavage, are fixed in a supporting jig and introduced it into a growth chamber for vapor phase epitaxy to grow the semiconductor layer. Therefore, the position of the laser bar is stabilized against the gas flow used for the growth, and it is possible to form a large-band-gap semiconductor layer having a desired thickness on the cleavage plane of a semiconductor wafer with high controllability.

The supporting jig used in the method of this invention is preferably formed from a material such as carbon, PBN, quartz, GaAs, Si or InP, or any combination thereof. Therefore, the supporting jig can be used at high temperatures in the growth chamber for vapor phase epitaxy, and it is possible to reduce the amount of impurity gases generated during the growth.

It is understood that various other modifications will be apparent to and can readily be made by those skilled in the art without departing from the scope and spirit of this invention. Accordingly, it is nor intended that the scope of the claims appended hereto be limited to the descriptions set forth herein, but rather that the claims be construed as encompassing all the features of patentable novelty that reside in the present invention, including all features that would be treated as equivalents thereof by those skilled in the art to which this invention pertains.

What is claimed is:

1. In a semiconductor laser device which is constituted by semiconductor materials so as to emit laser light from a cavity end facet, the laser light being excited in a waveguide within an active layer sandwiched between a pair of cladding layers, wherein a window layer made of a semiconductor material having a band gap greater than that of the active layer is formed on the cavity end facet from which the laser light is emitted, so as to have a sufficient thickness of 0.2 nm to 3 μm to prevent local generation of crystal defects by lattice mismatching between the semiconductor material of the window layer and the semiconductor materials at the cavity end facet.

2. In a semiconductor laser device according to claim 1, wherein the window layer has a band gap greater than that of the active layer by at least 300 meV.

3. In a semiconductor laser device according to claim 1, wherein the band gap of the window layer is greater than that of the cladding layers.

4. In a semiconductor laser device according to claim 1, wherein the window layer is covered with an insulating film so that the reflectivity of at least one of the cavity end facets becomes 5 to 20%.

5. In a semiconductor laser device according to claim 1, wherein the waveguide within the active layer has a uniform width.

6. In a semiconductor laser device according to claim 1, wherein the width of the waveguide within the active layer is smaller in the cavity portions near the end facets and greater in the center portion other than these end portions.

7. In a semiconductor laser device according to claim 1, wherein the semiconductor materials are AlGaAs.

8. In a semiconductor laser device according to claim 1, wherein the semiconductor materials are InGaAlP.

9. In a semiconductor laser device according to claim 1, wherein the semiconductor materials are a mixture of AlGaAs and InGaAlP.

10. In a semiconductor laser device according to claim 1, wherein a protective layer is formed on the surface of the window layer, the protective layer having a band gap different from that of the window layer.

11. In a semiconductor laser device according to claim 1, wherein a protective layer which is a sulfur-containing film is formed on the surface of the window layer.

12. In a semiconductor laser device according to claim 10 or 11, wherein the protective layer is covered with an insulating film so that the reflectivity of at least one of the cavity end facets becomes 5 to 20%.

13. A method for producing a semiconductor laser device which emits laser light from an end facet thereof and not only has an active layer for laser oscillation but also has a semiconductor layer with a band gap greater than that of the active layer, which is formed on the end facet, comprising the steps of:
cleaving a semiconductor laser wafer to form a plurality of bar-shaped wafers having a width which is substantially equivalent to a cavity length; and
fixing the bar-shaped wafers in a supporting jig and then introducing it into a growth chamber for vapor phase epitaxy to grow the semiconductor layer at least on the cleavage planes of the bar-shaped wafers.

14. A method according to claim 13, wherein the bar-shaped wafers are fixed by a fixing jig together with the supporting jig.

* * * * *